(12) United States Patent
Shimanuki

(10) Patent No.: US 7,566,969 B2
(45) Date of Patent: Jul. 28, 2009

(54) SEMICONDUCTOR DEVICE WITH IMPROVED ARRANGEMENT OF A THROUGH-HOLE IN A WIRING SUBSTRATE

(75) Inventor: Yoshihiko Shimanuki, Nanyo (JP)

(73) Assignee: Renesas Technology Corp., Tokyo (JP)

( * ) Notice: Subject to any disclaimer, the term of this patent is extended or adjusted under 35 U.S.C. 154(b) by 274 days.

(21) Appl. No.: 11/322,243

(22) Filed: Jan. 3, 2006

(65) Prior Publication Data

US 2006/0145344 A1 Jul. 6, 2006

(30) Foreign Application Priority Data

Jan. 5, 2005 (JP) ............................. 2005-000735

(51) Int. Cl.
*H01L 23/12* (2006.01)
*H01L 23/04* (2006.01)

(52) U.S. Cl. ................ 257/737; 257/738; 257/698; 257/774; 257/680; 257/700; 257/701; 257/784; 257/E23.069; 257/E23.068; 257/E23.067; 257/E23.07

(58) Field of Classification Search ................ 257/737, 257/738, 698, 774, E23.069, E23.068, E23.067, 257/E23.07, 668, 700, 701, 680, 778, 784, 257/786

See application file for complete search history.

(56) References Cited

U.S. PATENT DOCUMENTS

2007/0080360 A1 * 4/2007 Mirsky et al. ................. 257/99

FOREIGN PATENT DOCUMENTS

| JP | 8-288316 | 11/1996 |
|----|----------|---------|
| JP | 2001-237337 | 8/2001 |
| JP | 2002-190488 | 7/2002 |
| WO | 2004/049424 A2 * | 6/2004 |

* cited by examiner

*Primary Examiner*—Alexander O Williams
(74) *Attorney, Agent, or Firm*—Antonelli, Terry, Stout & Kraus, LLP.

(57) ABSTRACT

To miniaturize a semiconductor device, a package substrate is provided having terminals formed on the main surface, lands formed on the back surface, through holes formed by laser beam machining and arranged at the upper part of each of the lands, and plating films arranged in the through hole to connect the lands with the terminals electrically. A semiconductor chip is mounted on the main surface of the substrate, a conductive wire connects the pad of the chip and the substrate, and solder bumps are formed in the lands. Since the through holes are formed by laser beam machining, the openings of the through holes are small. Further, the through holes have a larger opening on the main surface of the package substrate than the opening on the back surface of the package substrate. Therefore, it becomes possible to arrange a solder bump directly under each of the through holes, and miniaturization can be realized.

12 Claims, 25 Drawing Sheets

SEMICONDUCTOR DEVICE WITH IMPROVED ARRANGEMENT OF A THROUGH-HOLE IN A WIRING SUBSTRATE

CROSS-REFERENCE TO RELATED APPLICATION

The present application claims priority from Japanese patent application No. 2005-000735 filed on Jan. 5, 2005, the content of which is hereby incorporated by reference into this application.

FIELD OF THE INVENTION

The present invention relates to a semiconductor device, and particularly relates to an effective technology in the application to narrow a pitch, increase pin count, and miniaturize a semiconductor device.

DESCRIPTION OF THE BACKGROUND ART

In a semiconductor device such as of a BGA (Ball Grid Array) type and a CSP (Chip Size Package) type, a die pattern smaller than the IC chip size and solder resist larger than the IC chip size and extending over the whole surface of a wiring board are formed on an IC chip adhesion side of the wiring board. A metallic pattern and solder resist having almost the same areas as in the IC chip adhesion side are formed on the side opposite to the IC chip adhesion side of the wiring board. A power-source pattern is formed on the perimeter of an IC chip, this power-source pattern and the IC chip are adhered with electroconductive adhesive, and the power-source pattern and the die pattern are connected with a wiring pattern (for example, refer to Patent Reference 1).

In a plastic package (semiconductor device), filling of a through hole is performed by filling up with conductive paste the inside of the through hole where a Cu plating layer which includes non-electrolyzed Cu plating and electrolysis Cu plating is formed on the surface of a wall. And a solder ball connection pad includes a part of a wiring pattern formed on the exposed surface of conductive paste and its perimeter, and Ni plating and Au plating are further performed on the solder ball connection pad (for example, refer to Patent Reference 2).

A molded member is fabricated by performing resin molding of a plurality of semiconductor chips collectively, in the state that the back surface of a strip substrate on which the semiconductor chips are mounted is vacuum-adsorbed to the lower die of a metal mold. Then, the strip substrate and molded member which are released from the metal mold are cut to obtain a plurality of semiconductor devices (for example, refer to Patent Reference 3).

[Patent Reference 1] Japanese Unexamined Patent Publication No. Hei 8-288316 (FIG. 1)

[Patent Reference 2] Japanese Unexamined Patent Publication No. 2001-237337 (FIG. 1)

[Patent Reference 3] Japanese Unexamined Patent Publication No. 2002-190488

SUMMARY OF THE INVENTION

In the semiconductor device which has external terminals such as a solder bump on the back surface of the wiring substrate, a plurality of through holes (via-hole) which electrically connect the back side to the main surface side are formed on the wiring substrate. This through hole is formed by drilling, and the back side is electrically connected to the main surface side with a plating film being arranged on the inner wall of the through hole.

With this structure, since the further inside of the plating film in the through hole becomes hollow, this hollow part is filled with insulating layers such as solder resist.

However, since the adhesiveness of a solder bump and solder resist is very low and they do not connect substantially with each other, a bump land is arranged in the location contiguous to a through hole in the back surface of a wiring substrate, and the solder bump which is an external terminal is connected to this bump land. That is, the through hole and the bump land (solder bump) are arranged not to align each other (for example, refer to Patent Reference 3 FIG. 11 and FIG. 12).

As a result, in a wiring substrate, the regions of both a bump land and a through hole are needed for one bump land in the wiring layout of the back surface. When a bump land and a through hole are arranged in the limited wiring area, the space between respective bump lands becomes extremely narrow. When a wiring of a feeder etc. is arranged between the bump lands, a restriction that the number of wiring which can be arranged between the respective bump lands decreases occurs. Even if it is the case where there is no restriction in a layout space, the efficiency of a wiring layout is bad and a wiring substrate cannot be made small. Thereby, it poses a problem that a narrowed pitch, increased pin count, and miniaturization of a semiconductor device cannot be realized.

In the semiconductor device of a BGA type or a CSP type, the heat generated from a semiconductor chip is radiated to the mounting substrate side via a wire, an electrode pad on a wiring substrate, a through hole, and a solder bump. However, like the above-mentioned Patent References 1 and 2, since the solder bump is formed on a bump land which is formed adjoining the through hole, the wiring route becomes longer by the length of wiring from the through hole to the solder bump. For this reason, there is a problem that heat radiation property cannot be improved.

A purpose of the present invention is to provide the technology by which miniaturization of a semiconductor device can be realized.

Another purpose of the present invention is to provide the technology by which a narrowed pitch of a semiconductor device can be realized.

Still another purpose of the present invention is to provide the technology by which an increased pin count of a semiconductor device can be realized.

Yet another purpose of the present invention is to provide the technology by which improvement in heat radiation property of a semiconductor device can be realized.

The above-described and the other purposes and novel features of the present invention will become apparent from the description herein and accompanying drawings.

Of aspects of the inventions disclosed in the present application, typical ones will next be summarized briefly.

That is, the present invention comprises: a wiring substrate having a main surface, a back surface opposite to the main surface, a plurality of terminals formed on the main surface, a plurality of lands formed on the back surface, a through hole formed by laser beam machining, and a conductor portion which is arranged in the through hole and connects the land to the terminal; a semiconductor chip mounted on the main surface of the wiring substrate; a conductive member electrically connecting an electrode of the semiconductor chip to the terminal of the wiring substrate; and an external terminal formed in each of the lands of the back surface of the wiring substrate; wherein the through hole is formed in a location lapping with the land and the external terminal in plan view.

Advantages achieved by some of the most typical aspects of the inventions disclosed in the present application will be briefly described below.

Since a plurality of through holes of the wiring substrate are formed by laser beam machining, an opening of the through hole can be made small. Thereby, since an external terminal can be arranged directly under the through hole in a semiconductor device, a wiring substrate can be made small and, as a result, miniaturization of the semiconductor device can be achieved. Since it becomes possible to arrange the through hole and the land connecting the external terminal in the same location, the wiring route from the through hole to an external terminal can be shortened, and improvement in the heat radiation property of the semiconductor device can be achieved.

DETAILED DESCRIPTION OF THE PREFERRED EMBODIMENTS

Figure 1:
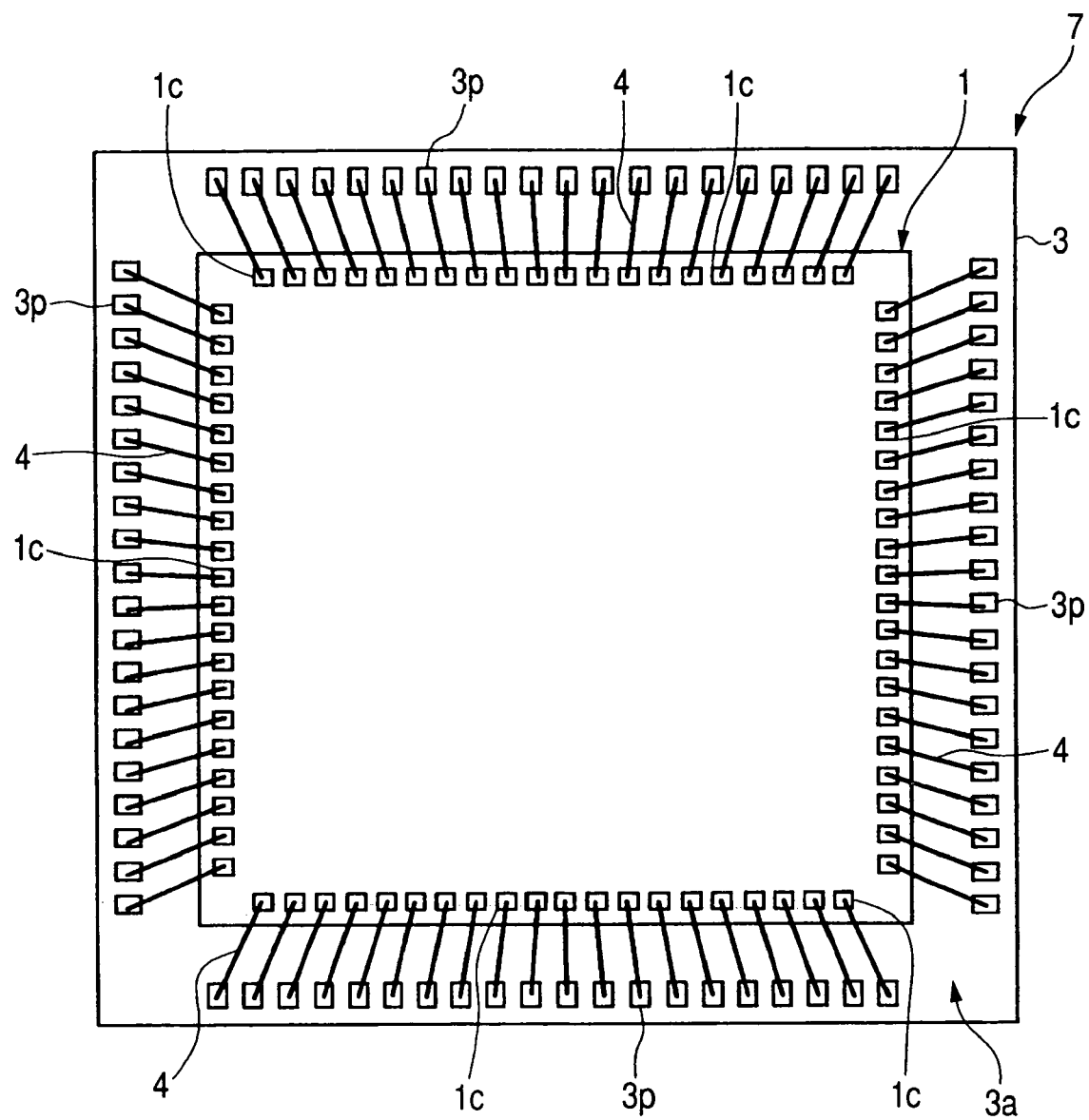
FIG. 1 is a plan view showing an example of the structure of the semiconductor device of Embodiment 1 of the present invention.

In the following embodiments, except the time when especially required, explanation of the same or same part is not repeated in principle.

Furthermore, in the below-described embodiments, a description will be made after divided into plural sections or plural embodiments if necessary for convenience. These plural sections or embodiments are not independent each other, but in a relation such that one is a modification example, details or complementary description of a part or whole of the other one unless otherwise specifically indicated.

And, in the below-described embodiments, when reference is made to the number of elements (including the number, value, amount and range), the number is not limited to a specific number but can be greater than or less than the specific number unless otherwise specifically indicated or principally apparent that the number is limited to the specific number.

Hereafter, embodiments of the invention are explained in detail based on the drawings. In all the drawings for describing the embodiments, members of a like function will be identified by like reference numerals and overlapping descriptions will be omitted.

Embodiment 1

Figure 2:
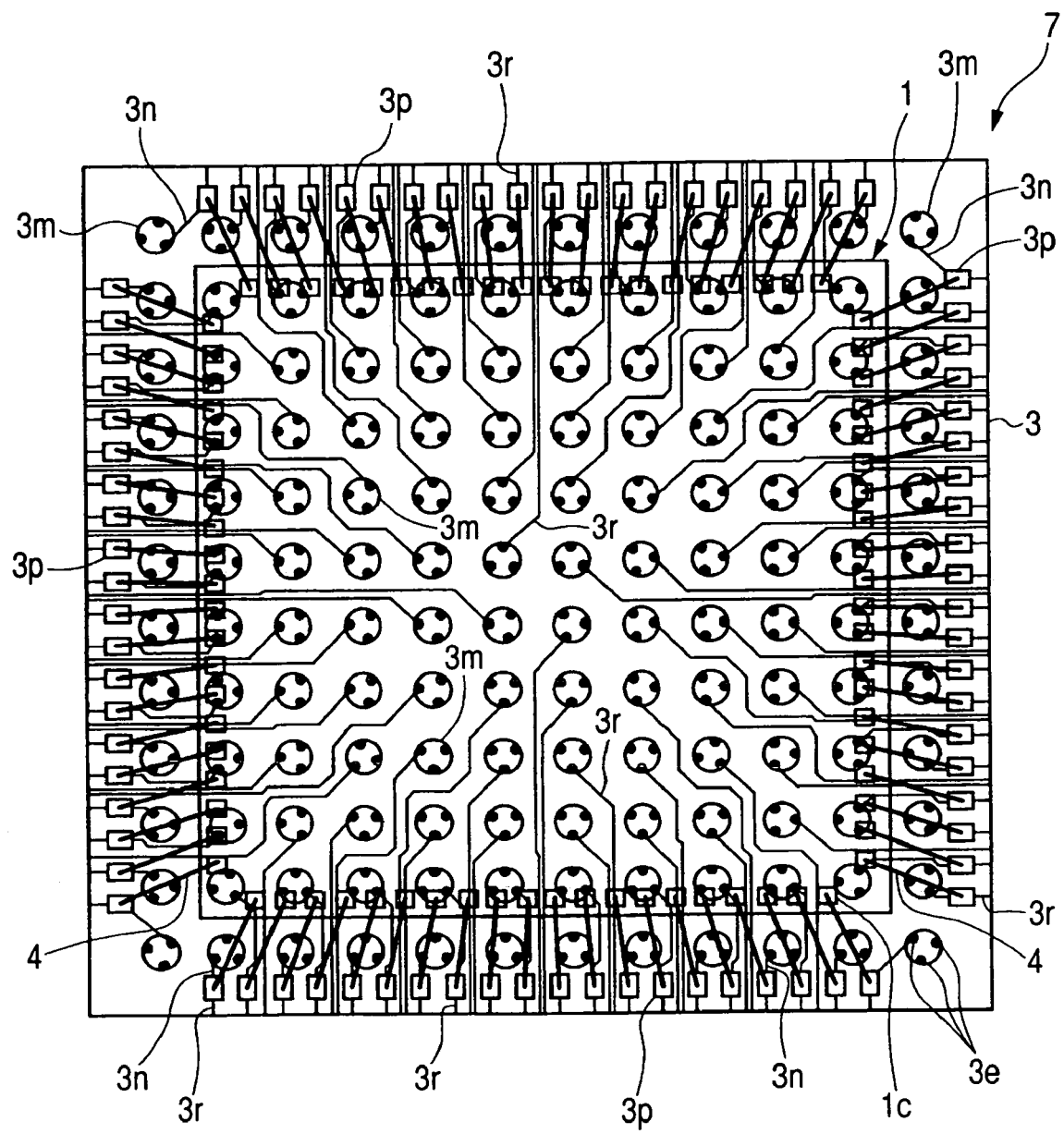
FIG. 2 is a plan view showing an example of the conductor pattern on the main surface side of a wiring substrate penetrating a molded body and a semiconductor chip in the semiconductor device shown in FIG. 1.
Figure 3:
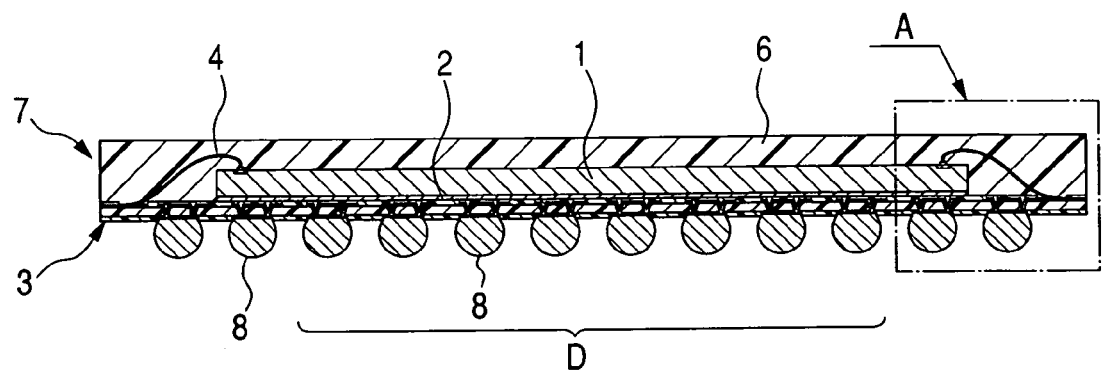
FIG. 3 is a sectional view showing an example of the structure of the semiconductor device shown in FIG. 1.
Figure 4:
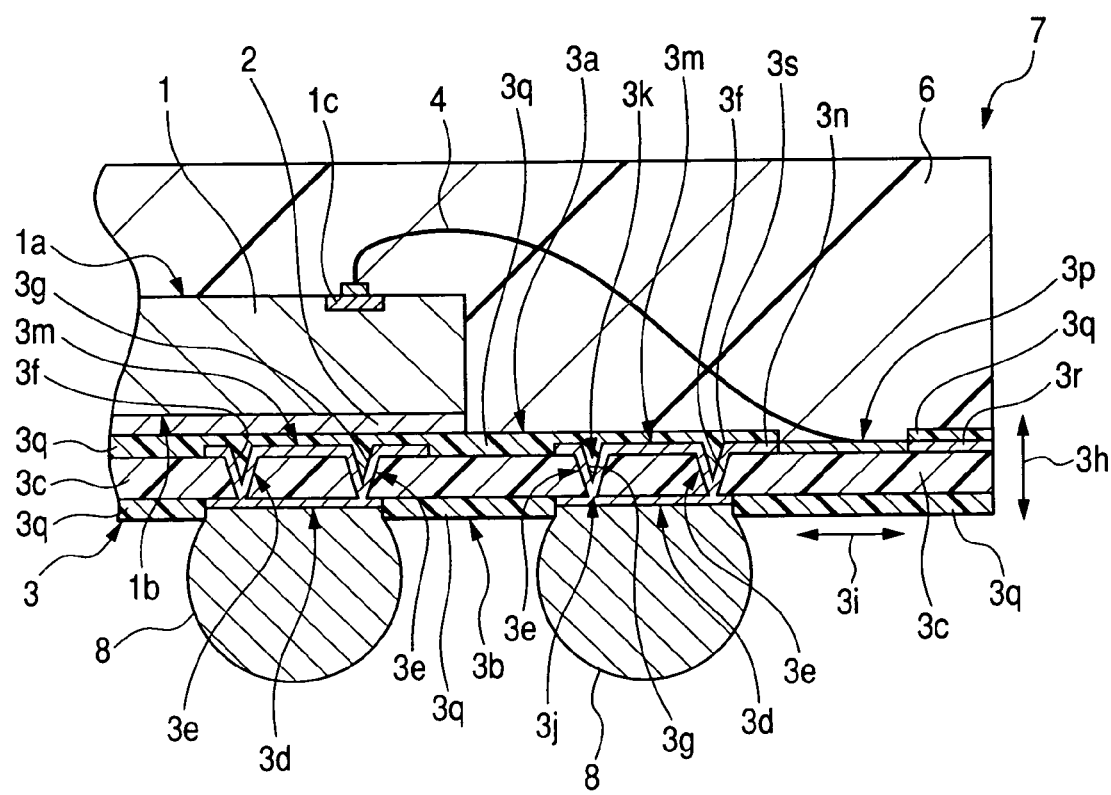
FIG. 4 is an enlarged partial sectional view showing the structure of the A section shown in FIG. 3.
Figure 5:
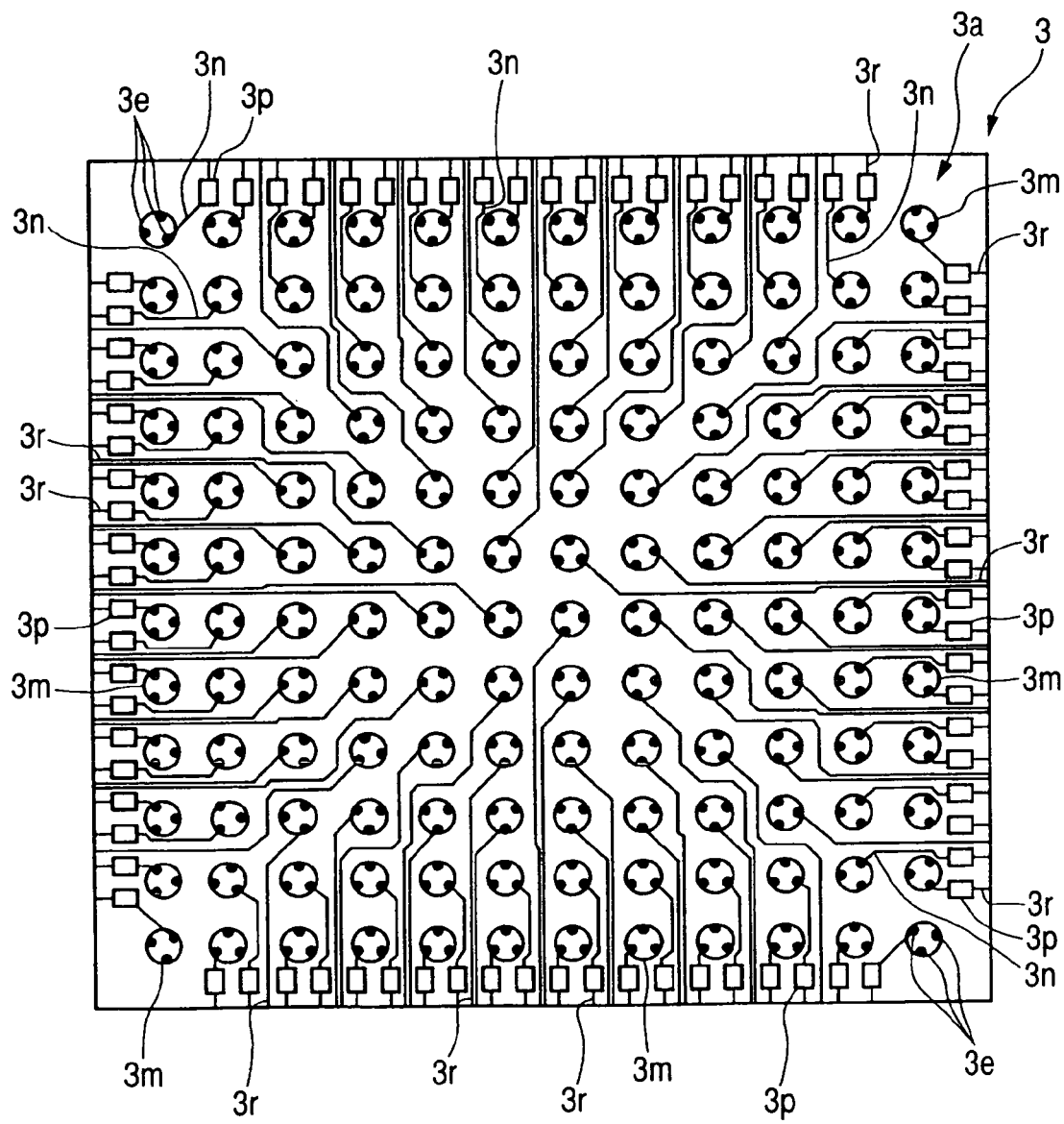
FIG. 5 is a plan view showing an example of the structure of the wiring substrate included in the semiconductor device shown in FIG. 1.
Figure 6:
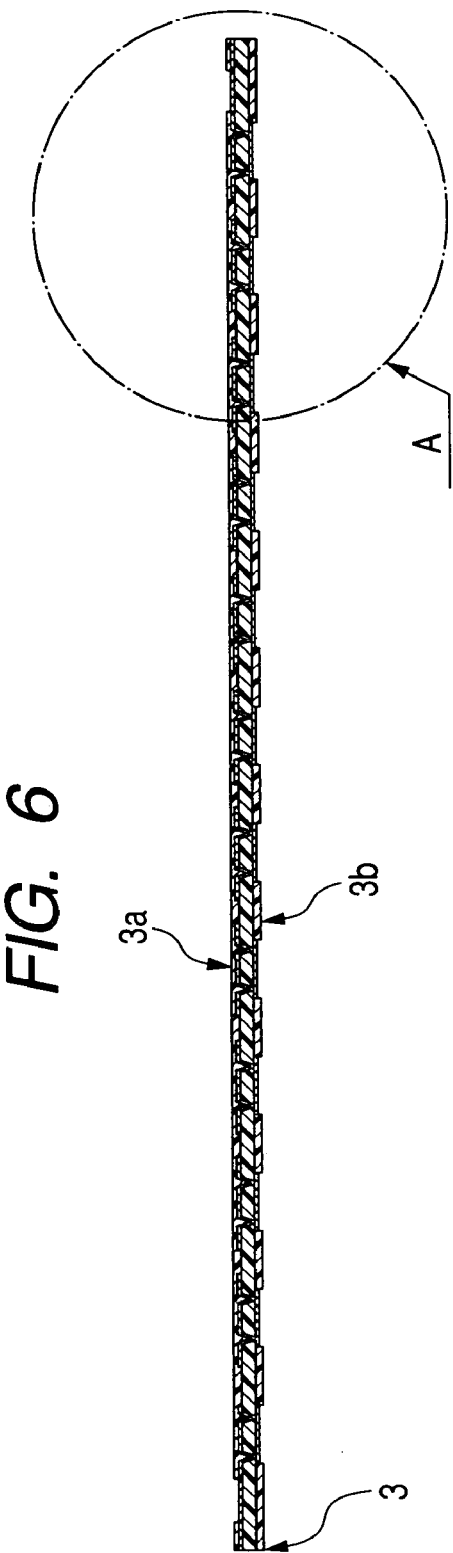
FIG. 6 is a sectional view showing an example of the structure of the wiring substrate shown in FIG. 5.
Figure 7:
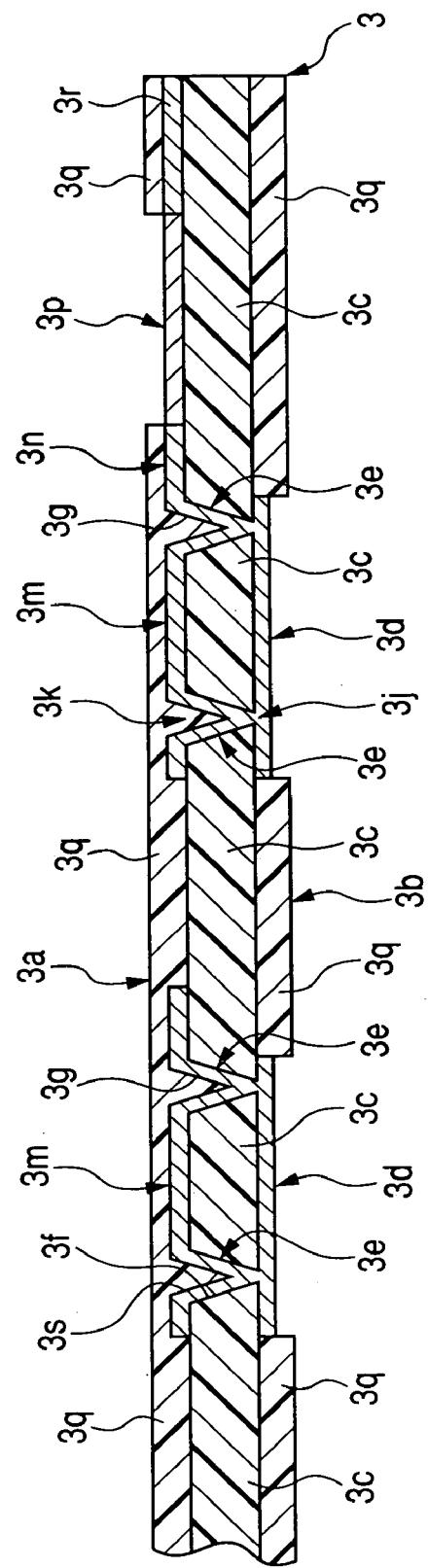
FIG. 7 is an enlarged partial sectional view showing the structure of the section A shown in FIG. 6.
Figure 8:
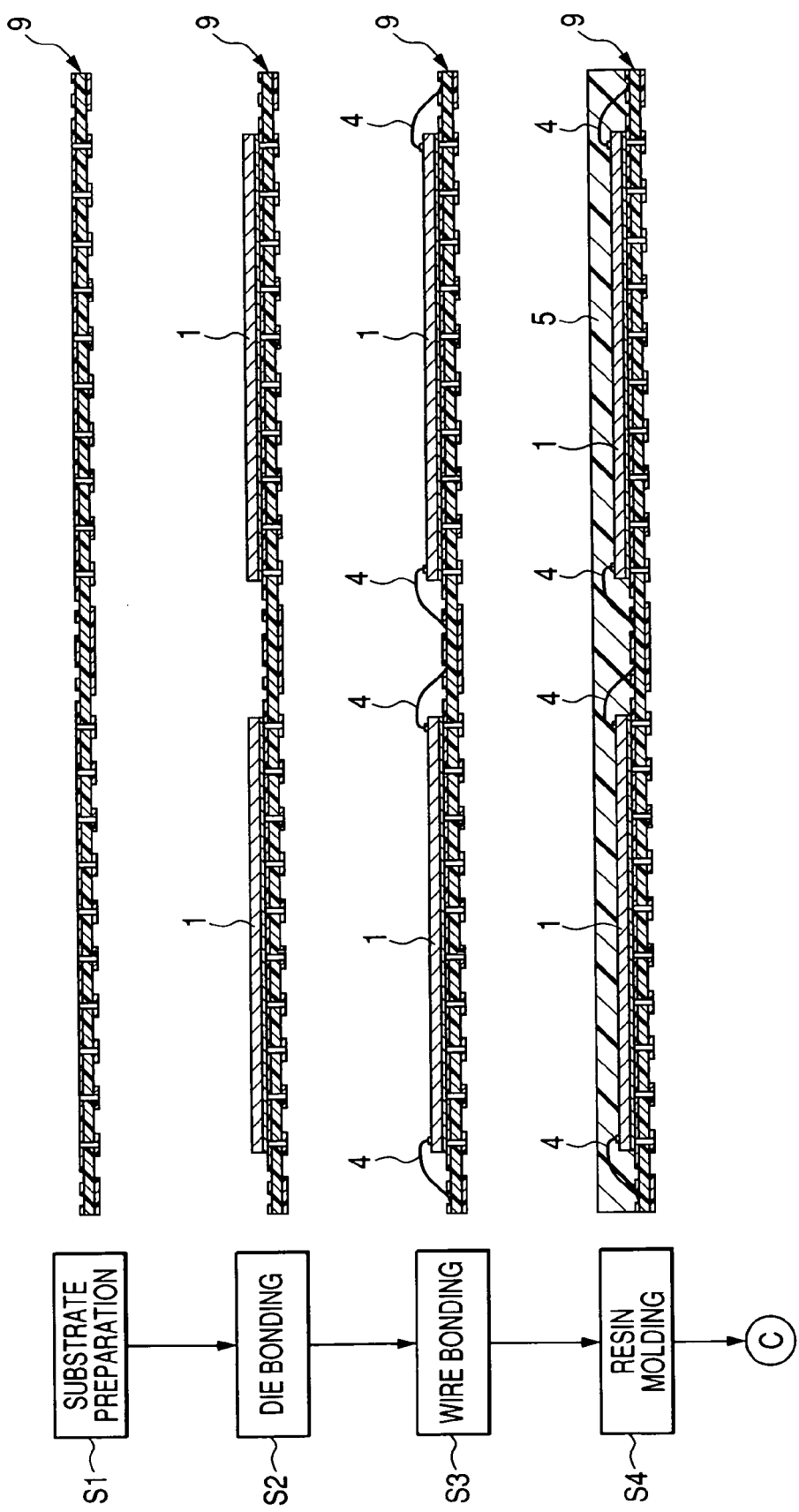
FIG. 8 is a manufacturing process flow chart showing an example of the assembly up to a resin molding in the assembly of the semiconductor device shown in FIG. 1.
Figure 9:
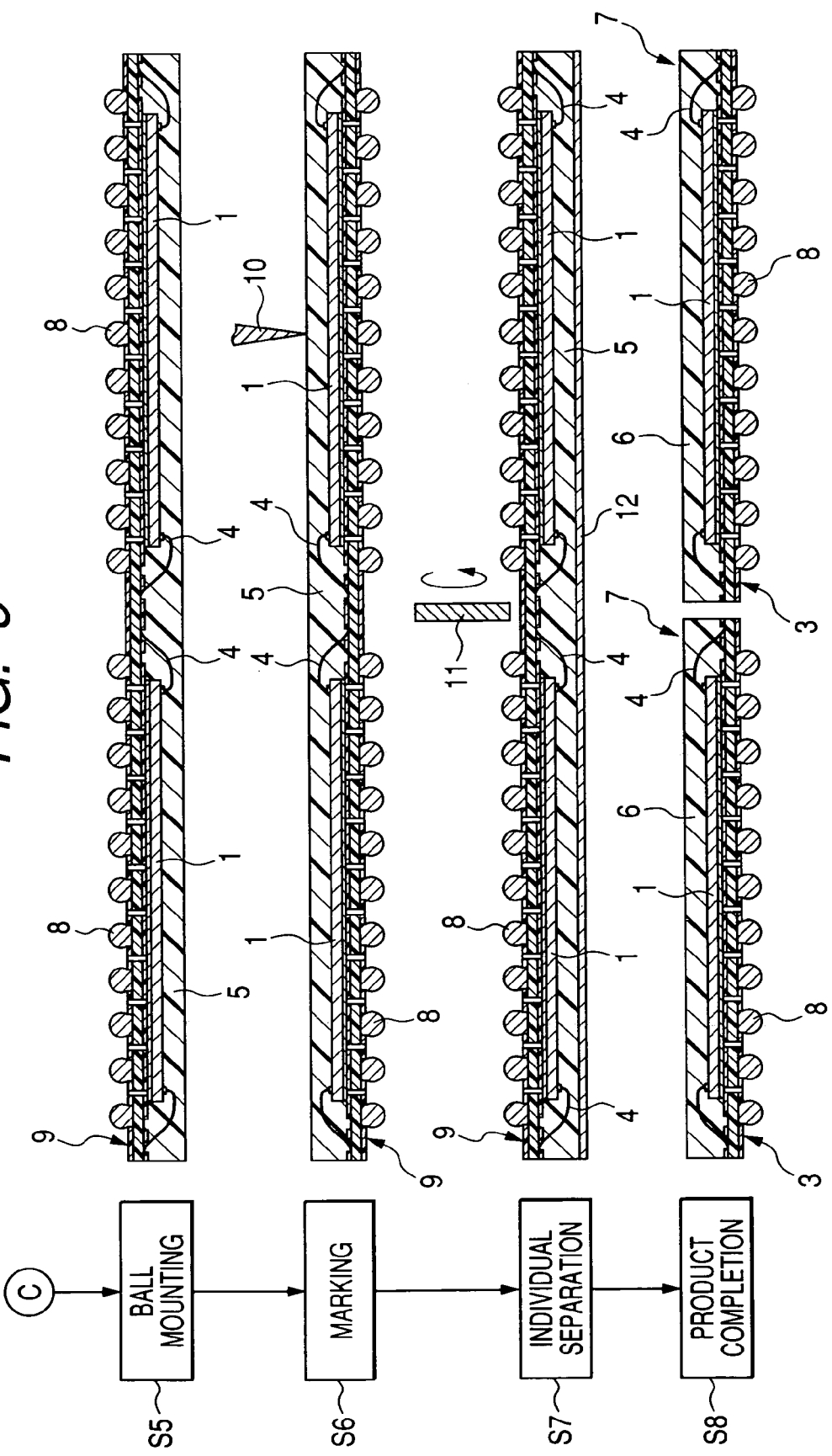
FIG. 9 is a manufacturing process flow chart showing an example of the assembly after a resin molding in the assembly of the semiconductor device shown in FIG. 1.
Figure 10:
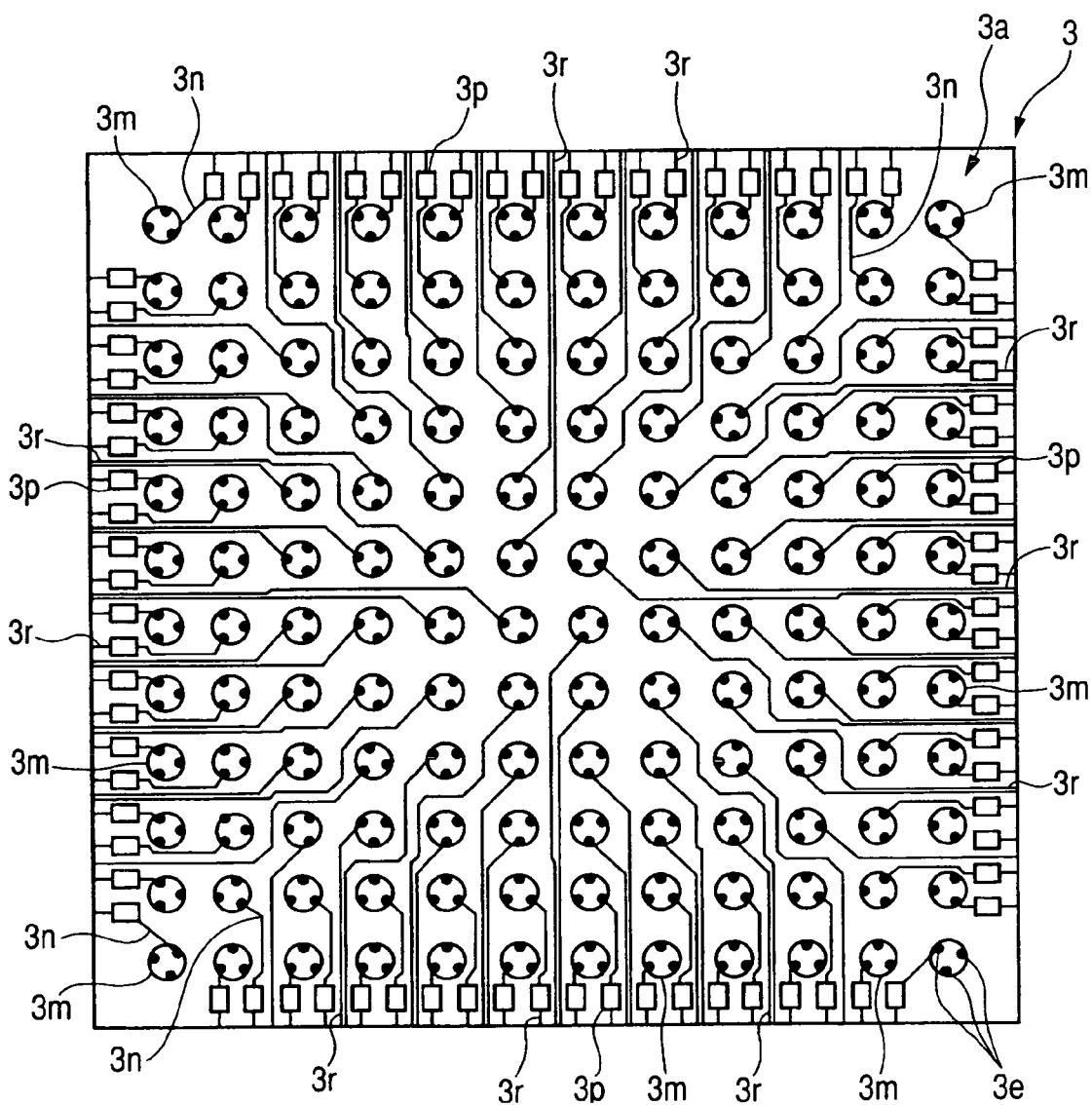
FIG. 10 is a plan view showing the conductor pattern on the main surface side of the wiring substrate of the modification of Embodiment 1 of the present invention.
Figure 11:
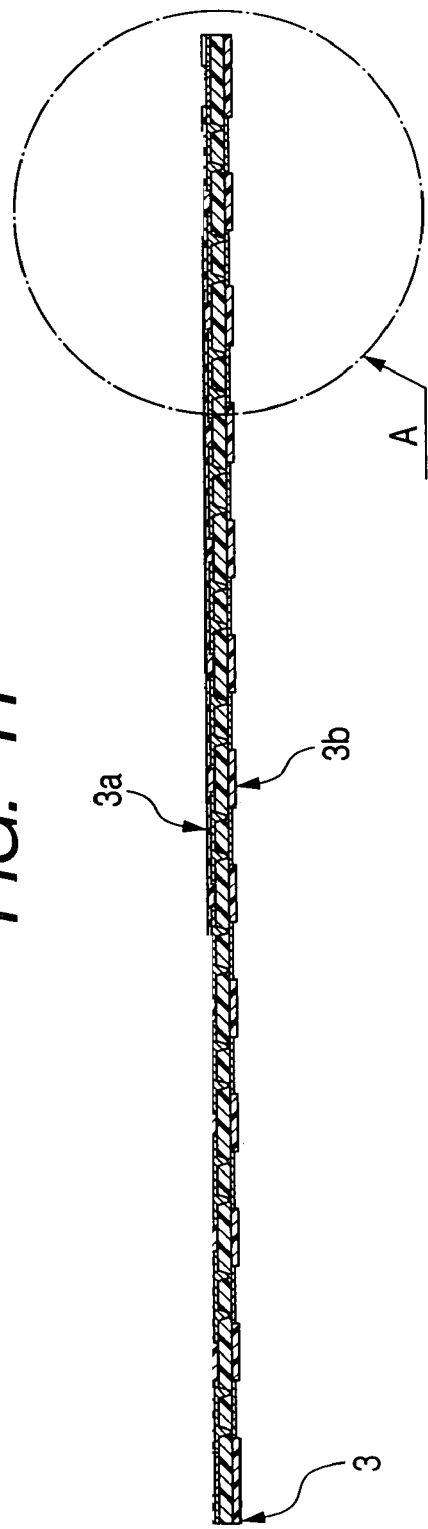
FIG. 11 is a sectional view showing the structure of the wiring substrate shown in FIG. 10.
Figure 12:
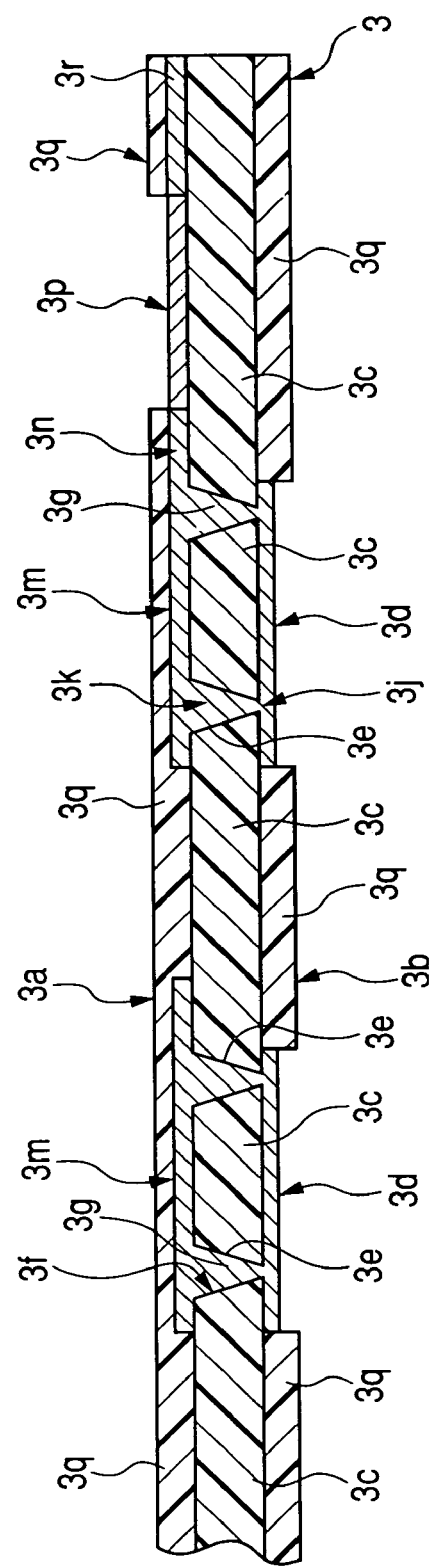
FIG. 12 is an enlarged partial sectional view showing the structure of the section A shown in FIG. 11.
Figure 13:
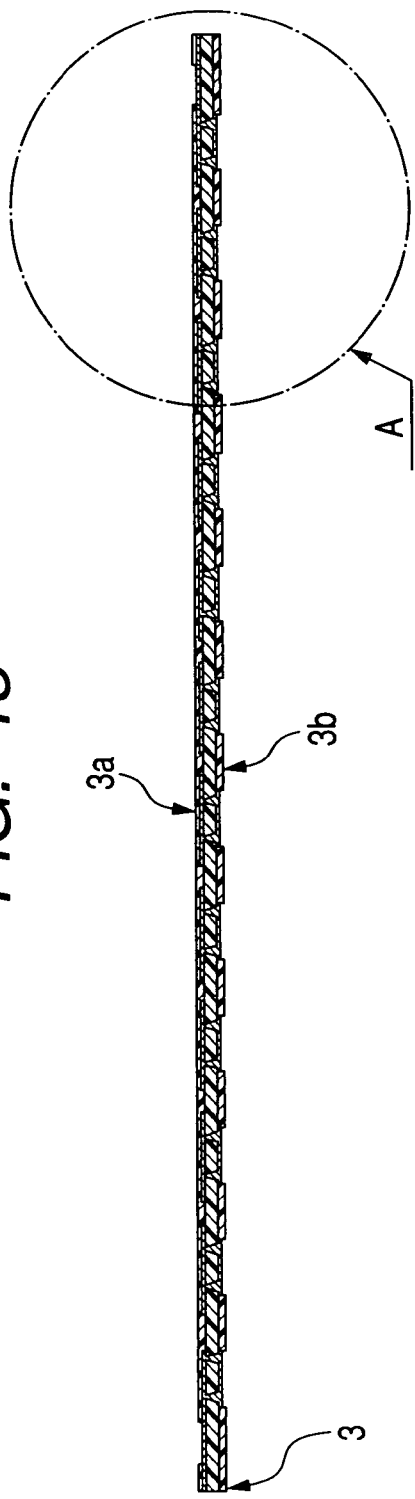
FIG. 13 is a sectional view showing the structure of the wiring substrate of the modification of Embodiment 1 of the present invention.
Figure 14:
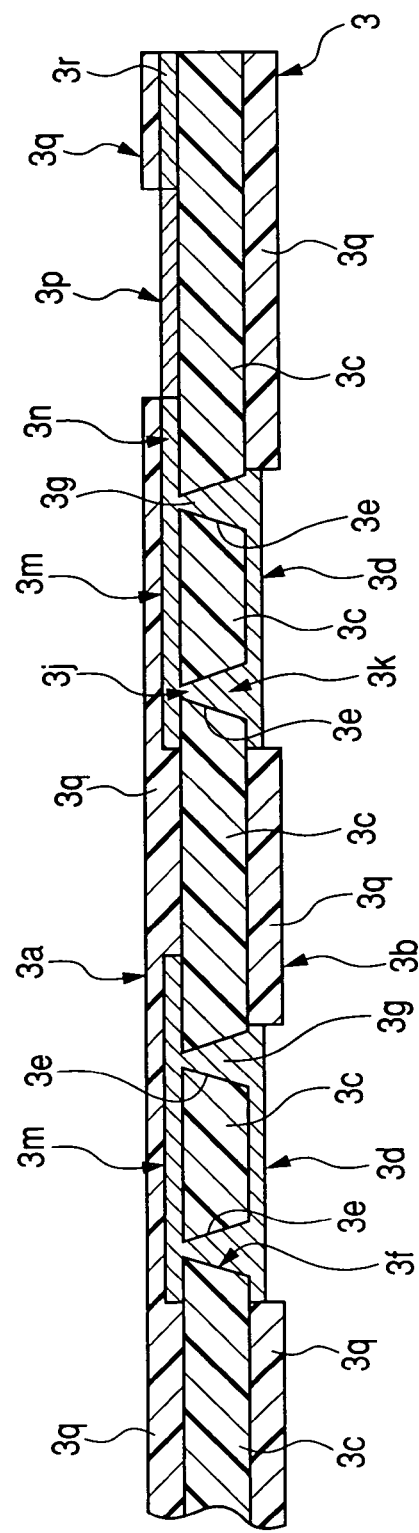
FIG. 14 is an enlarged partial sectional view showing the structure of the section A shown in FIG. 13.
Figure 15:
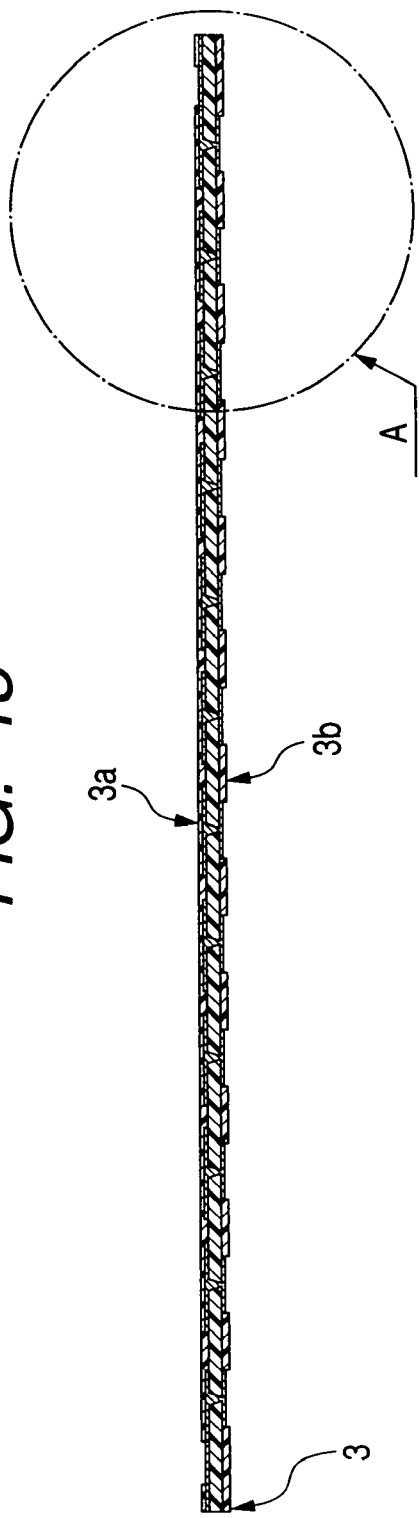
FIG. 15 is a sectional view showing the structure of the wiring substrate of the modification of Embodiment 1 of the present invention.
Figure 16:
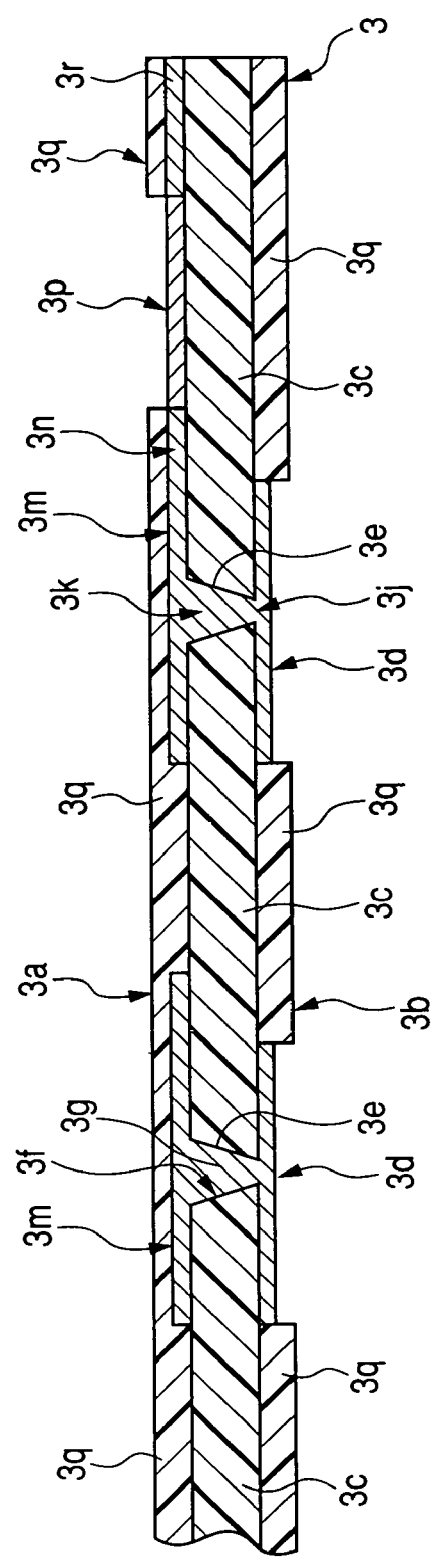
FIG. 16 is an enlarged partial sectional view showing the structure of the section A shown in FIG. 15.
Figure 17:
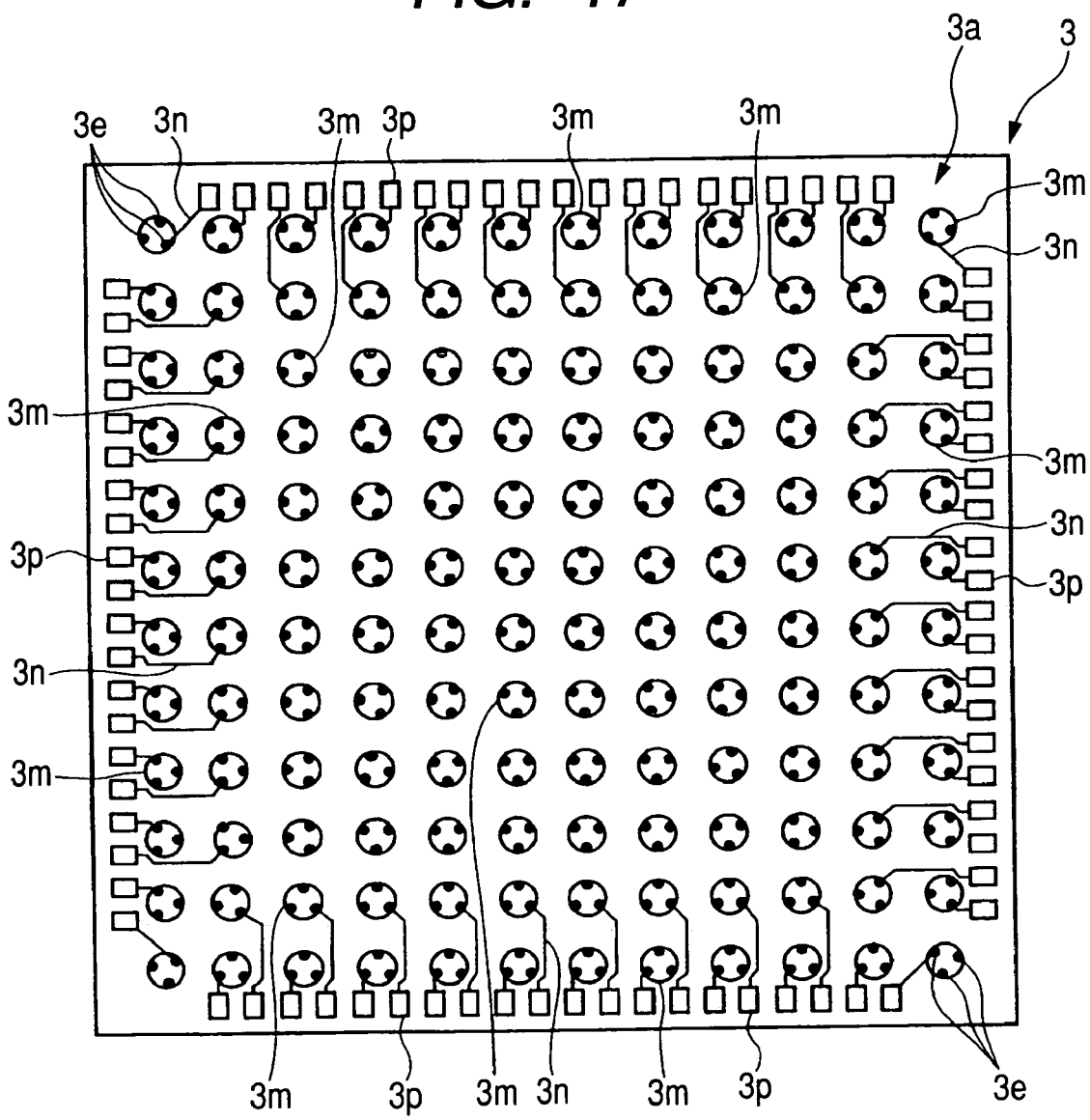
FIG. 17 is a plan view showing the conductor pattern on the main surface side of the wiring substrate of the modification of Embodiment 1 of the present invention.
Figure 18:
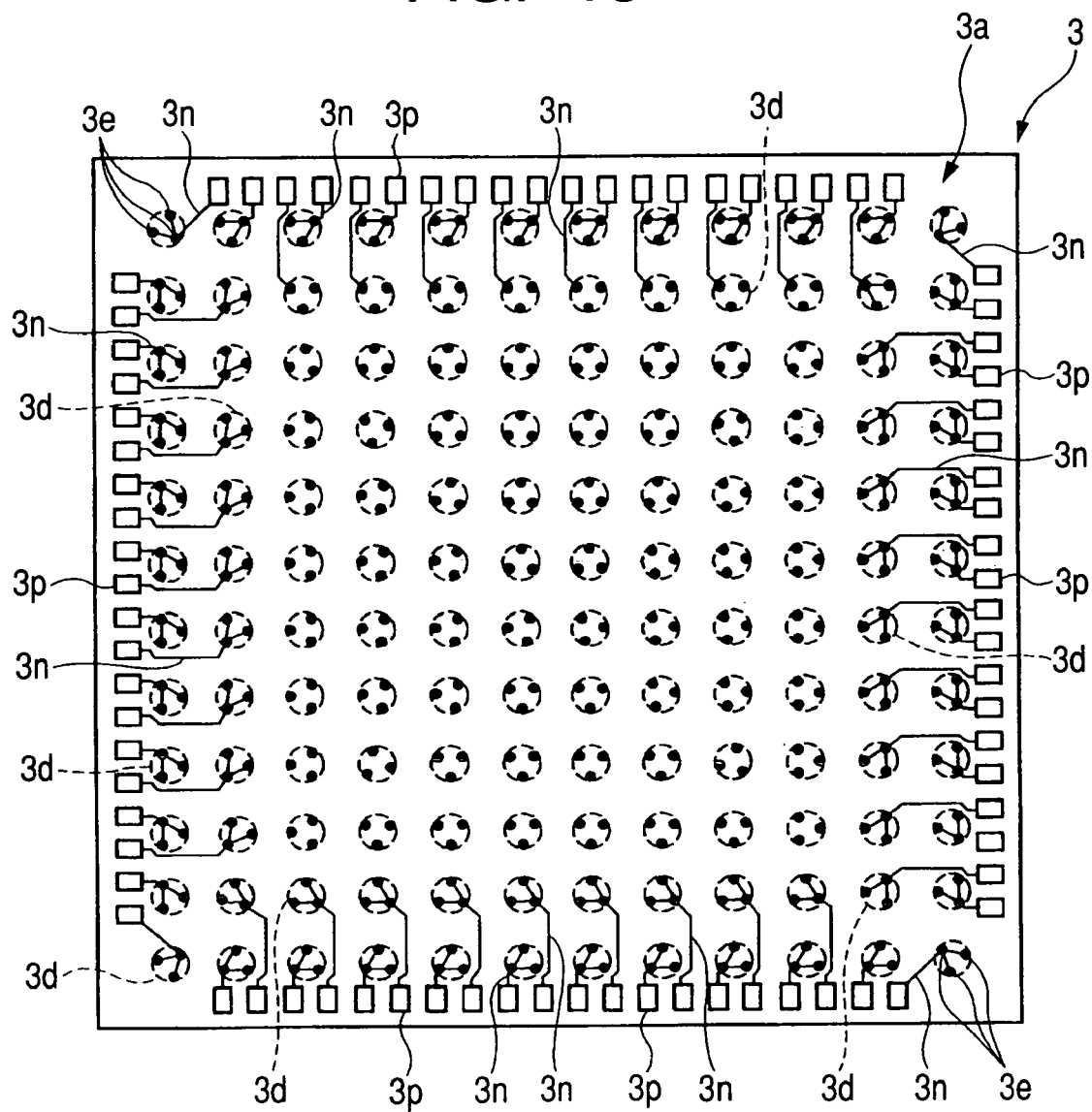
FIG. 18 is a plan view showing the conductor pattern on the main surface side of the wiring substrate of the modification of Embodiment 1 of the present invention.
Figure 19:
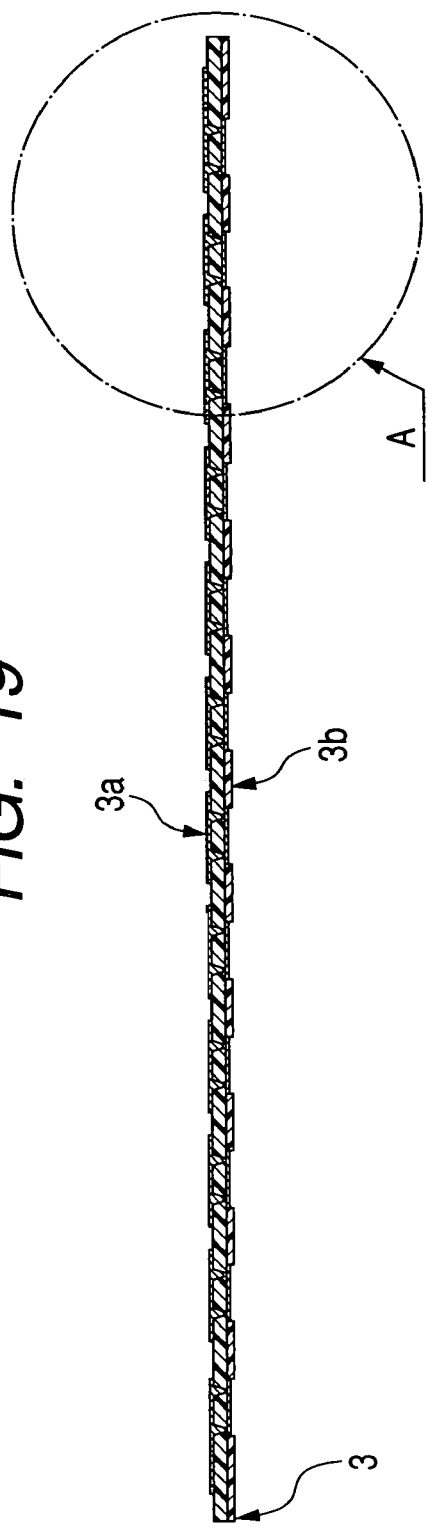
FIG. 19 is a sectional view showing the structure of the wiring substrate shown in FIG. 18.
Figure 20:
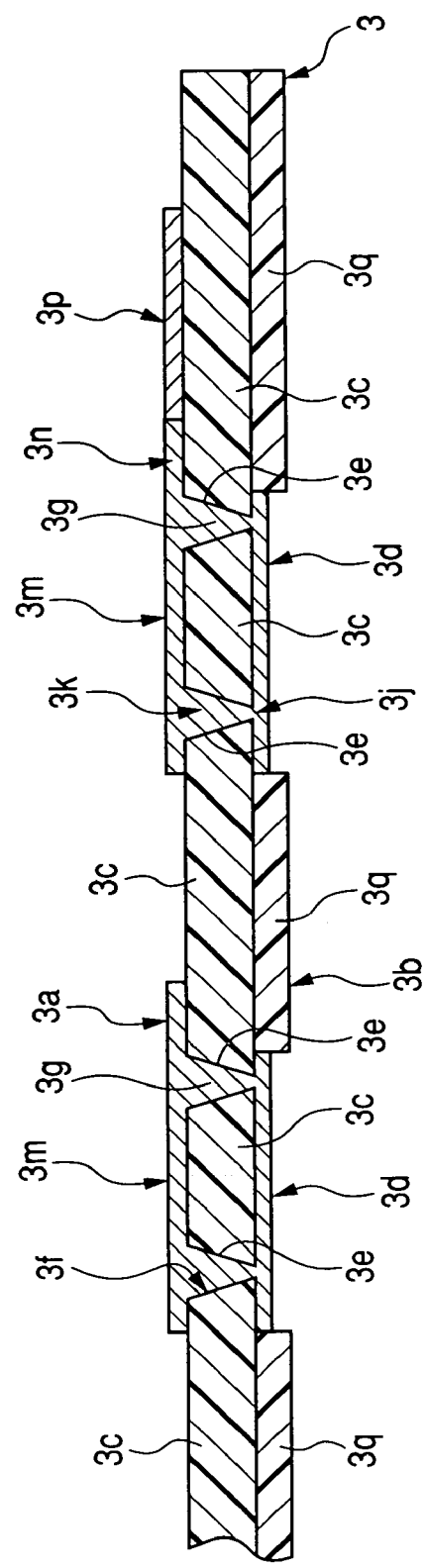
FIG. 20 is an enlarged partial sectional view showing the structure of the section A shown in FIG. 19.

FIG. 1 is a plan view showing an example of the structure of the semiconductor device of Embodiment 1 of the present invention, FIG. 2 is a plan view showing an example of the conductor pattern on the main surface side of a wiring substrate penetrating a molded body and a semiconductor chip in the semiconductor device shown in FIG. 1, FIG. 3 is a sectional view showing an example of the structure of the semiconductor device shown in FIG. 1, FIG. 4 is an enlarged partial sectional view showing the structure of the section A shown in FIG. 3; FIG. 5 is a plan view showing an example of the structure of the wiring substrate included in the semiconductor device shown in FIG. 1; FIG. 6 is a sectional view showing an example of the structure of the wiring substrate shown in FIG. 5, FIG. 7 is an enlarged partial sectional view showing the structure of the section A shown in FIG. 6, FIG. 8 is a manufacturing process flow chart showing an example of the assembly up to a resin molding in the assembly of the semiconductor device shown in FIG. 1, FIG. 9 is a manufacturing process flow chart showing an example of the assembly after a resin molding in the assembly of the semiconductor device shown in FIG. 1, FIG. 10 is a plan view showing the conductor pattern on the main surface side of the wiring substrate of the modification of Embodiment 1 of the present invention; FIG. 11 is a sectional view showing the structure of the wiring substrate shown in FIG. 10, FIG. 12 is an enlarged partial sectional view showing the structure of the section A shown in FIG. 11, FIG. 13 is a sectional view showing the structure of the wiring substrate of the modification of Embodiment 1 of the present invention, FIG. 14 is an enlarged partial sectional view showing the structure of the section A shown in FIG. 13, FIG. 15 is a sectional view showing the structure of the wiring substrate of the modification of Embodiment 1 of the present invention; FIG. 16 is an enlarged partial sectional view showing the structure of the section A shown in FIG. 15, FIG. 17 is a plan view showing the conductor pattern on the main surface side of the wiring substrate of the modification of Embodiment 1 of the present invention, FIG. 18 is a plan view showing the conductor pattern on the main surface side of the wiring substrate of the modification of Embodiment 1 of the present invention, FIG. 19 is a sectional view showing the structure of the wiring substrate shown in FIG. 18, and FIG. 20 is an enlarged partial sectional view showing the structure of the section A shown in FIG. 19.

The semiconductor device of Embodiment 1 is a small semiconductor package of a plastic molded type in which semiconductor chip 1 is mounted on a wiring substrate, and CSP (Chip Scale Package) 7 as shown in FIG. 1-FIG. 4 is taken up and explained as an example in Embodiment 1.

In CSP 7, solder bumps 8 which are a plurality of external terminals are attached to back surface 3b of a wiring substrate being arranged in a lattice manner, therefore CSP 7 is a BGA (Ball Grid Array) type semiconductor package.

The structure of CSP 7 is explained using FIG. 1-FIG. 4. Package substrate 3 which is a wiring substrate having main surface 3a, back surface 3b facing main surface 3a, a plurality of terminals 3m formed on main surface 3a, a plurality of lands 3d formed on back surface 3b, through hole 3e which is formed by laser beam machining and has been arranged at the upper part of each of a plurality of lands 3d, and plating film 3g (a conductor portion, a conductor film, a conductor pattern) which is arranged in through hole 3e, and connects land 3d to terminals 3m electrically, semiconductor chip 1 which is mounted in main surface 3a of package substrate 3 and has an integrated circuit, conductive wire 4 which electrically connects pad 1c being an electrode of semiconductor chip 1 and terminal for bonding 3p of package substrate 3, and which is a conductive member, solder bumps 8 which are a plurality of external terminals formed in a plurality of lands 3d of back surface 3b of package substrate 3, and molded body 6 for resin molding semiconductor chip 1 and a plurality of conductive wires 4 are included, and solder bump 8 is arranged at the lower part of through hole 3e formed in package substrate 3. The shape in plan view of package substrate 3 which intersects the thickness is a rectangular shape, and it is a square in Embodiment 1.

That is, as shown in FIG. 4, in plane direction 3i of package substrate 3, solder bump 8 is arranged at the same location as through hole 3e of package substrate 3.

In CSP 7 of Embodiment 1, each of a plurality of through holes 3e of package substrate 3 is formed by laser beam machining. In the laser beam machining, when a through hole is formed in a substrate, as compared with the case where a through hole is formed by drilling, the hole size of a through hole can be made very small. Opening 3j on the front side of the direction of laser movement differs in the size from opening 3k on the backside thereof in a through hole (refer to FIG. 4).

In laser beam machining, the intensity of a laser is the highest at the center thereof, and the intensity of the laser becomes lower as it separates further from the center to the periphery. Therefore, since the intensity is high at the center of the laser, it penetrates a substrate, but since the intensity at a periphery is low compared with this, it does not penetrate. As shown in FIG. 4 as the result, the shape of the cross section along thickness directions 3h of the substrate in through hole 3e becomes a trapezoid (right trapezoid). That is, inner walls 3f of through hole 3e are formed to incline with respect to thickness directions 3h of a substrate (direction of movement of a laser).

In the case of package substrate 3 shown in FIG. 4, the shape of opening 3j on the front side of the direction of laser movement is circular of about 0.02-0.03 mm in diameter, on the other hand, the shape of opening 3k on the backside of the direction of laser movement is circular of about 0.05-0.07 mm in diameter. It is more desirable to make opening 3j smaller on the side of back surface 3b, since solder bump 8 attaches to the back surface 3b side of package substrate 3. That is, in through hole 3e, the area of opening 3j opened on back surface 3b is smaller than the area of opening 3k opened on main surface 3a. In through hole 3e, the shape of the cross section cut along plane direction 3i of a substrate is circular.

As shown in FIG. 4, plating film 3g which is a conductor portion is arranged on inner wall 3f of through hole 3e. Terminal 3m on the side of main surface 3a of package substrate 3 and land 3d on the side of back surface 3b are electrically connected by this plating film 3g. Plating film 3g is copper plating including a copper alloy, for example, and the thickness is about 0.02 mm, for example.

Therefore, since opening 3j with a smaller opening in through hole 3e is circular of about 0.02-0.03 mm in diameter, this opening 3j can be plugged up by virtue of the thickness of plating film 3g by arranging plating film 3g to inner wall 3f of through hole 3e.

Thereby, in CSP 7, solder bump 8 is connectable with land 3d directly under through hole 3e. Furthermore, since not an insulating layer like solder resist but plating film 3g has plugged up opening 3j as a portion of land 3d, the bond strength of land 3d and solder bump 8 is also secured. For this reason, as for opening 3j whose hole size is smaller than that of opening 3k, since solder bump 8 attaches to the back surface 3b side of package substrate 3, it is preferred for opening 3j to form in the back surface 3b side of package substrate 3.

Thus, since a plurality of through holes 3e of package substrate 3 are formed by laser beam machining and opening 3j of through hole 3e can be made small by this in CSP 7 of Embodiment 1, solder bump 8 can be arranged directly under through hole 3e in CSP 7. As a result, it becomes possible to arrange through hole 3e in the same location as land 3d which connects solder bump 8. Therefore, in back surface 3b of package substrate 3, wiring can be arranged efficiently.

Thereby, package substrate 3 can be made small and CSP 7 can be further narrower in the pitch and further miniaturized.

Since through hole 3e is formed by laser beam machining toward one surface (back surface 3b) side from the other surface (main surface 3a) side, the hole size of through hole 3e can be made small, and the area occupied by the wiring part in a substrate can be enlarged. As a result, the pin count of CSP 7 can be further increased.

Since it becomes possible to arrange through hole 3e in the same location as land 3d which connects solder bump 8, the wiring route from through hole 3e to solder bump 8 can be shortened, and, as a result, the heat radiation property of CSP 7 can be improved.

Semiconductor chip 1 is formed with silicon etc., for example, and the integrated circuit is formed on the main surface 1a thereof. The shape in plan view of semiconductor chip 1 which intersects the thickness is a rectangular shape, and it is a square in Embodiment 1. As shown in FIG. 1, a plurality of electrodes (hereinafter referred to as a "pad") 1c electrically connected with an integrated circuit are formed in the periphery of main surface 1a. This pad 1c and terminal for bonding 3p arranged in the periphery of main surface 3a of package substrate 3 are electrically connected by conductive wire (conductive member) 4, respectively. In that case, as shown in FIG. 2 and FIG. 4, pad 1c of semiconductor chip 1 is electrically connected with terminal for bonding 3p connected with terminals 3m of main surface 3a of package substrate 3 by wiring 3n by conductive wire 4. This conductive wire 4 is a gold wire etc., for example.

As shown in FIG. 4, the back surface 1b adheres to package substrate 3 via adhesives 2, and semiconductor chip 1 is mounted in package substrate 3 with main surface 1a facing upwardly.

Molded body 6 which performs resin molding of semiconductor chip 1 or the conductive wire 4 is formed with the thermosetting epoxy resin etc., for example.

As CSP 7 of Embodiment 1 is shown in FIG. 2, a plurality of circular terminals 3m are arranged in a lattice manner at the predetermined interval all over main surface 3a of package substrate 3, and land 3d is arranged via through hole 3e on the back surface 3b side of each terminal 3m. Solder bump 8 is connected to each land 3d. Therefore, a plurality of solder bumps 8 are also arranged in a lattice manner at the completely same interval as terminals 3m. That is, CSP 7 is a full grid type semiconductor package.

However, as shown in FIG. 5, terminals 3m of rows up to the second rows from the outside are connected with terminal for bonding 3p in the periphery via wiring 3n among a plurality of terminals 3m arranged in a lattice manner on main surface 3a of package substrate 3. Therefore, solder bumps 8 shown in the section D of FIG. 3 which are arranged as the third rows from the outside and their inside rows are bumps for the bonding reinforcement at the time of substrate mounting while being bumps for improvement in heat conduction for conducting the heat from semiconductor chip 1 to a mounting substrate.

Thus, by forming solder bumps 8 in a lattice arrangement all over back surface 3b of package substrate 3 and making the portion of a plurality of solder bumps 8 into the bump for the improvement in heat conduction (thermal bump), the heat radiation property of CSP 7 can be improved further.

Terminal for bonding 3p, wiring 3n, terminals 3m, and plating film 3g which are formed on main surface 3a of package substrate 3 are formed by supplying power via feeder 3r formed in the periphery of main surface 3a shown in FIG. 5. That is, they are formed by the electrolytic plating method.

As for package substrate 3, a plurality of through holes 3e are formed in base material 3c by laser beam machining. As shown in FIG. 7, the main surface 3a side exposes only terminal for bonding 3p, and the others including feeder 3r, wiring 3n, terminals 3m, and plating film 3g are covered with solder-resist film 3q which is an insulating layer. On the other hand, only each land 3d is exposed on the back surface 3b side, and regions other than each land 3d are covered with solder-resist film 3q. Feeder 3r, wiring 3n, terminal 3m, plating film 3g, etc. are formed with the electrolytic plating film. If resin molding is performed in the condition of not covering these electrolytic plating films with solder-resist film 3q, a metal plating film will directly contact to molded body 6. Since the adhesion of solder-resist film 3q and molded body 6 is higher than the adhesion of an electrolysis plating film and molded body 6, it can suppress a trouble that molded body 6 peels from package substrate 3, or moisture advances into molded body 6.

In package substrate 3 of CSP 7 of Embodiment 1, as shown in FIG. 6 and FIG. 7, a plurality of through holes 3e are arranged to each of a plurality of lands 3d. Here, as shown in FIG. 5, three through holes 3e connect to one terminal 3m (land 3d). Three through holes 3e are arranged along the peripheral part of each terminal 3m (each land 3d) in that case.

Thus, since a plurality of through holes 3e are formed to each land 3d (each terminal 3m), heat transfer can be improved and the heat radiation property of CSP 7 can be improved further. Even if one wiring in a through hole is disconnected, the conduction between the front surface and the rear surface of a wiring substrate can be secured by other through hole wiring. Thereby, the reliability of a semiconductor device can be improved.

In each through hole 3e, plating film 3g is arranged on the inner wall 3f. Since plating film 3g is formed in almost uniform thickness, as shown in FIG. 7, hollow 3s by plating film 3g is formed near opening 3k on the main surface 3a side of through hole 3e. Therefore, solder-resist film 3q is embedded in hollow 3s by plating film 3g near opening 3k on the main surface 3a side of through hole 3e.

Next, the manufacturing method of CSP 7 of Embodiment 1 is explained using the manufacturing process flow chart shown in FIG. 8 and FIG. 9.

First, the substrate shown in step S1 of FIG. 8 is prepared. Here, multi-chip substrate 9 in which block arrangement of a plurality of regions that form package substrate 3 is performed is prepared. For the region on which package substrate 3 is formed, through hole 3e explained above is formed.

Then, semiconductor chip 1 is adhered via adhesives 2 shown in FIG. 4 on multi-chip substrate 9 by die bonding shown in step S2.

Then, wire bonding shown in step S3 is performed. Here, as shown in FIG. 4, pad 1c of main surface 1a of semiconductor chip 1 and terminal for bonding 3p of package substrate 3 of multi-chip substrate 9 corresponding to this pad 1c are electrically connected via conductive wire 4, such as a gold wire.

Then, the resin molding shown in step S4 is performed. Here, on multi-chip substrate 9, resin molding of a plurality of semiconductor chips 1 and a plurality of conductive wires 4 is performed collectively so that batch molded body 5 is formed. The resin for moldings which forms batch molded body 5 includes a thermosetting epoxy resin etc., for example.

Then, ball mounting shown in step S5 of FIG. 9 is performed, and as shown in FIG. 4, solder bump 8 is connected to each land 3d. At this time, solder bump 8 is arranged in the location where solder bump 8 overlaps with through hole 3e in plan view.

Then, the marking shown in step S6 is performed. Here, a mark is given to batch molded body 5 by marking 10 by the laser marking method etc. Marking 10 may be performed by the ink marking method etc., for example.

Then, individual separation shown in step S7 is performed. Here, dicing tape 12 is stuck on the surface of batch molded body 5, and each CSP 7 is individually separated by cutting with dicing blade 11 while that batch molded body 8 is fixed with dicing tape 12.

Thereby, as shown in step S8, the assembly of CSP 7 is completed to give a final product.

Next, the modification of Embodiment 1 is explained.

In the modification shown in FIG. 10-FIG. 12, plating film 3g which is the conductor portion formed by plating is embedded thoroughly in through hole 3e of package substrate 3 as shown in FIG. 12. Therefore, in each terminal 3m, a hollow or the like corresponding to hollow 3s as shown in FIG. 7 is not formed. That is, in order that hollow 3s as shown in FIG. 7 may not be formed at each terminal 3m, plating film 3g may be thoroughly embedded in through hole 3e.

This can be realized by lengthening time of plating formation, when forming plating films 3g by an electrolytic plating method via feeders 3r shown in FIG. 10 and FIG. 12.

Thus, by embedding plating films 3g thoroughly in through hole 3e, the heat radiation property of CSP 7 as shown in FIG. 4 can be improved further.

In the modification shown in FIG. 13 and FIG. 14, opening 3j of the small area in through hole 3e has been arranged to the main surface 3a side, and opening 3k of a large area is arranged to the back surface 3b side. It is also possible to arrange opening 3k of a large area on the back surface 3b side by forming, like the modification shown in FIG. 12, plating films 3g in such a manner that the plating films 3g are thoroughly embedded in through hole 3e. The heat radiation property of CSP 7 as shown in FIG. 4 can be improved further also in the structure shown in FIG. 14. Since the adhesion area where plating films 3g to which solder bump 8 is connected with base material 3c of package substrate 3 is large, bond strength of solder bump 8 increases and temperature cycle property improves. Since the usable area of terminal 3m can take widely, double bonding and triple bonding to terminal 3m become possible.

Therefore, when plating films 3g are formed in such a manner that they are thoroughly embedded in through hole 3e, openings 3j and 3k may be arranged on any of main surface 3a and back surface 3b.

In the modification shown in FIG. 15 and FIG. 16, the number of through holes 3e arranged in each terminal 3m (each land 3d) is set to one, and plating films 3g are formed in such a manner that they are thoroughly embedded in through hole 3e.

That is, the number of through holes 3e arranged in each terminal 3m (each land 3d) may be one, and may be plural.

The modification shown in FIG. 17 illustrates package substrate 3 on which each conductor pattern of main surface 3a is formed with the electroless plating method. Among a plurality of terminals 3m arranged in a lattice manner, terminals 3m of rows up to the second rows from the outside are electrically connected with terminals for bonding 3p via wirings 3n. That is, terminals 3m arranged as the third rows from the outside and their inside rows are terminals 3m for the bonding reinforcement at the time of substrate mounting while being terminals 3m for improvement in heat conduction to conduct the heat from semiconductor chip 1 (referring to FIG. 4) to a mounting substrate. Since the wiring of feeders 3r connected to terminals 3m at the center side in package substrate 3 becomes unnecessary, the manufacturing process can be simplified compared with Embodiment 1. Since feeder 3r is not arranged between terminals 3m which adjoin each other among a plurality of terminals 3m, the interval of adjoining terminals 3m spreads, and a poor contact can be suppressed. Since the number of feeders 3r arranged between terminals 3m can be reduced compared with Embodiment 1 and the interval of terminals 3m can be shortened, miniaturization of a semiconductor device can be realized.

The modification shown in FIG. 18-FIG. 20 is the structure where terminals 3m as shown in FIG. 17 are not formed on main surface 3a of package substrate 3, and terminal for bonding 3p and each through hole 3e are directly connected via wiring 3n.

That is, three through holes 3e are formed on each land 3d of back surface 3b, respectively, and further, as shown in FIG. 18, in main surface 3a, terminal for bonding 3p and through hole 3e are directly connected with wiring 3n.

On the surface of the main surface 3a side, solder-resist film 3q which is an insulating layer as shown in FIG. 16 is not arranged. That is, solder-resist film 3q is arranged only on the back surface 3b side, as shown in FIG. 20.

Thus, since solder-resist film 3q which is an insulating layer is not formed on the surface of package substrate 3, the effectiveness of heat conduction can be improved compared with the case where the surface of package substrate 3 is covered by solder-resist film 3q, and, thereby, the heat radiation property of a semiconductor device can be improved further.

Feeder 3r as shown in FIG. 10 is not arranged on the outside of each terminal for bonding 3p. That is, the conductor pattern of package substrate 3 shown in FIG. 18 is formed by an electroless plating method.

Embodiment 2

Figure 21:
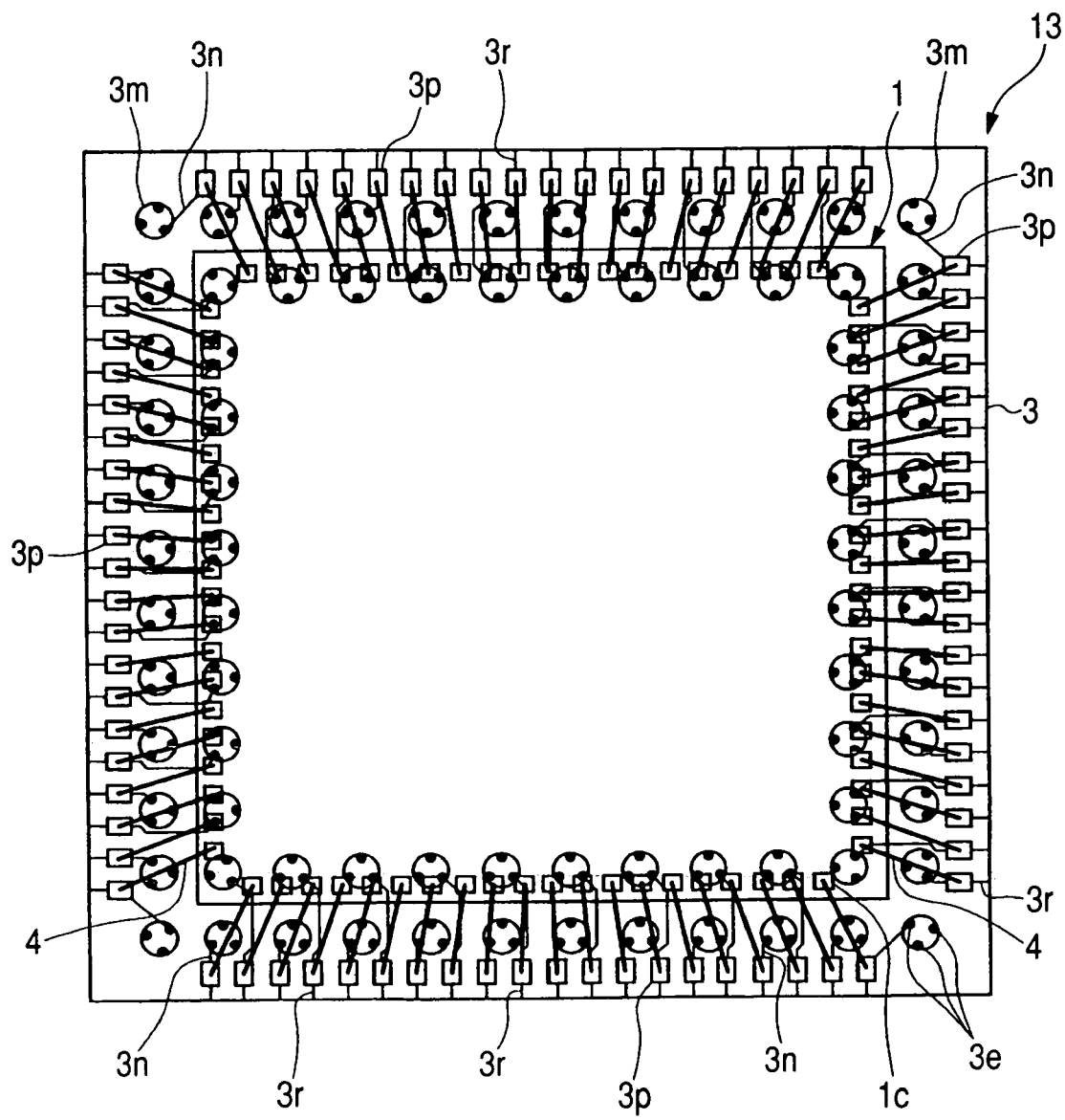
FIG. 21 is a plan view showing an example of the conductor pattern on the main surface side of a wiring substrate penetrating a molded body and a semiconductor chip in the semiconductor device of Embodiment 2 of the present invention.
Figure 22:
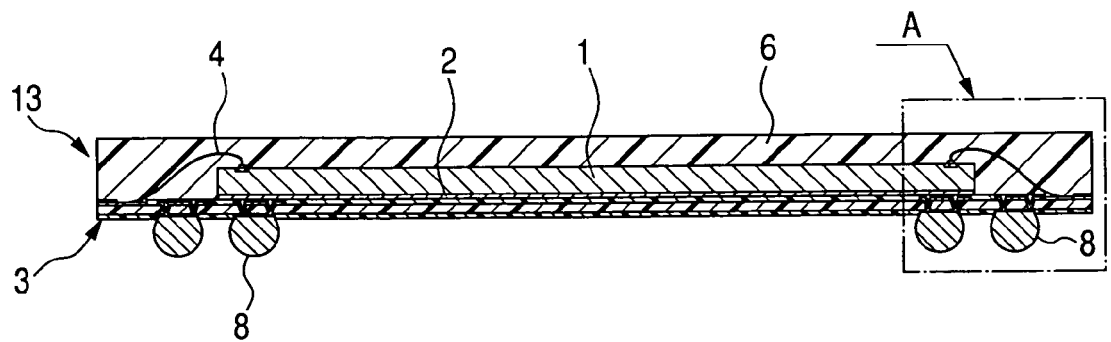
FIG. 22 is a sectional view showing an example of the structure of the semiconductor device shown in FIG. 21.
Figure 25:
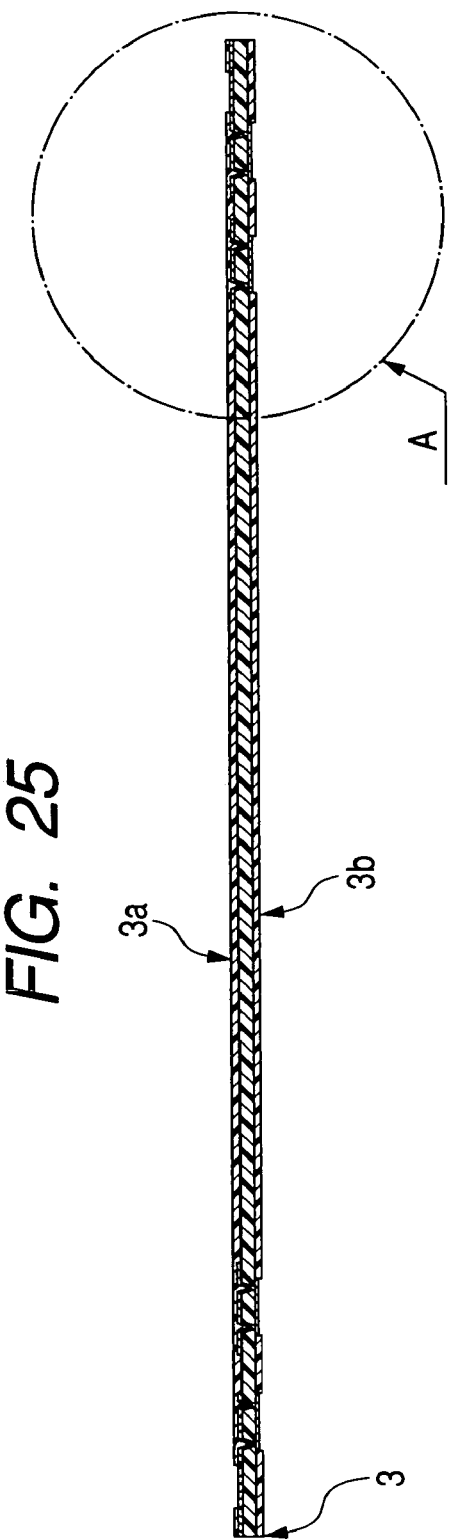
FIG. 25 is a sectional view showing an example of the structure of the wiring substrate shown in FIG. 24.
Figure 26:
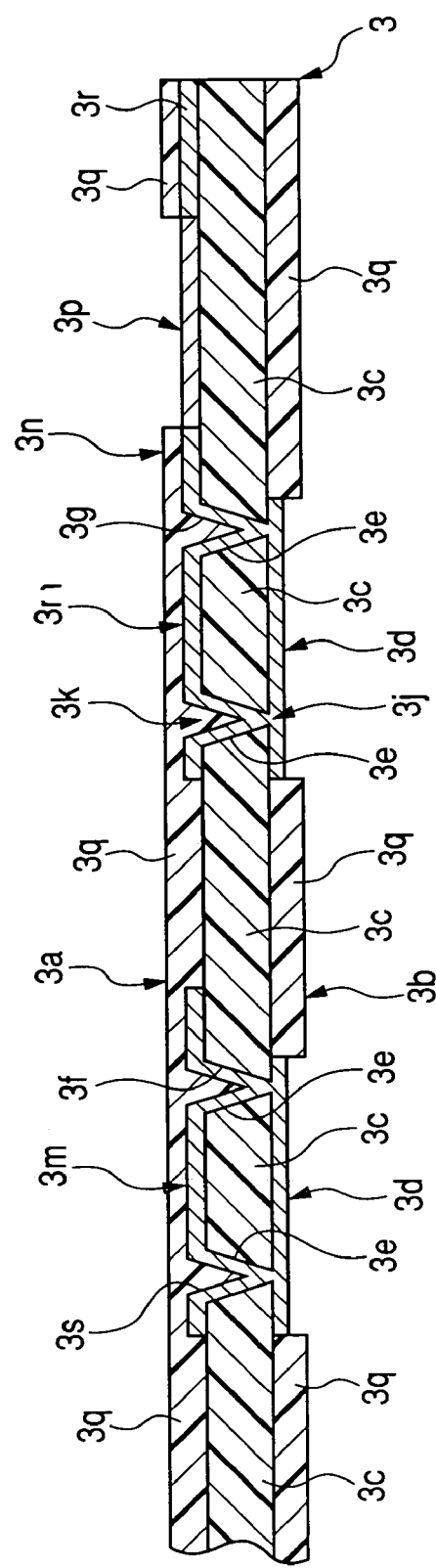
FIG. 26 is an enlarged partial sectional view showing the structure of the section A shown in FIG. 25.
Figure 27:
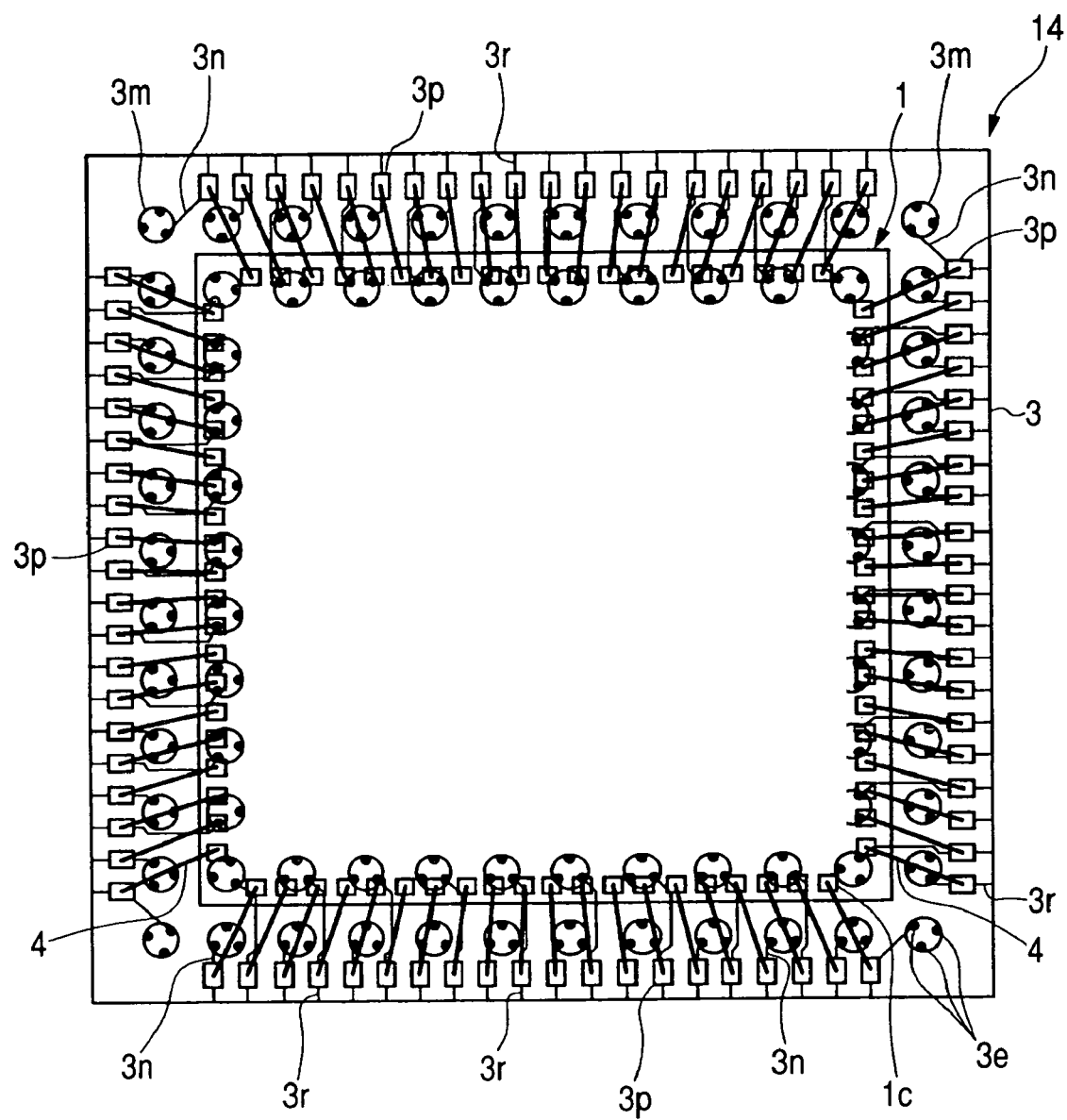
FIG. 27 is a plan view showing the conductor pattern on the main surface side of a wiring substrate penetrating a molded body and a semiconductor chip in the semiconductor device of the modification of Embodiment 2 of the present invention.
Figure 28:
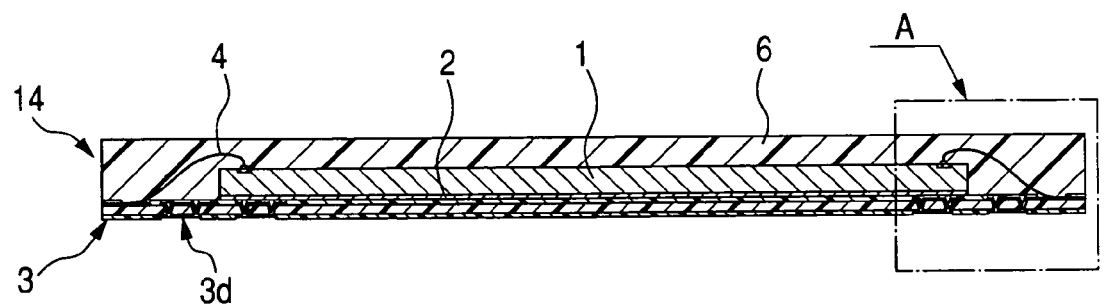
FIG. 28 is a sectional view showing an example of the structure of the semiconductor device shown in FIG. 27.
Figure 29:
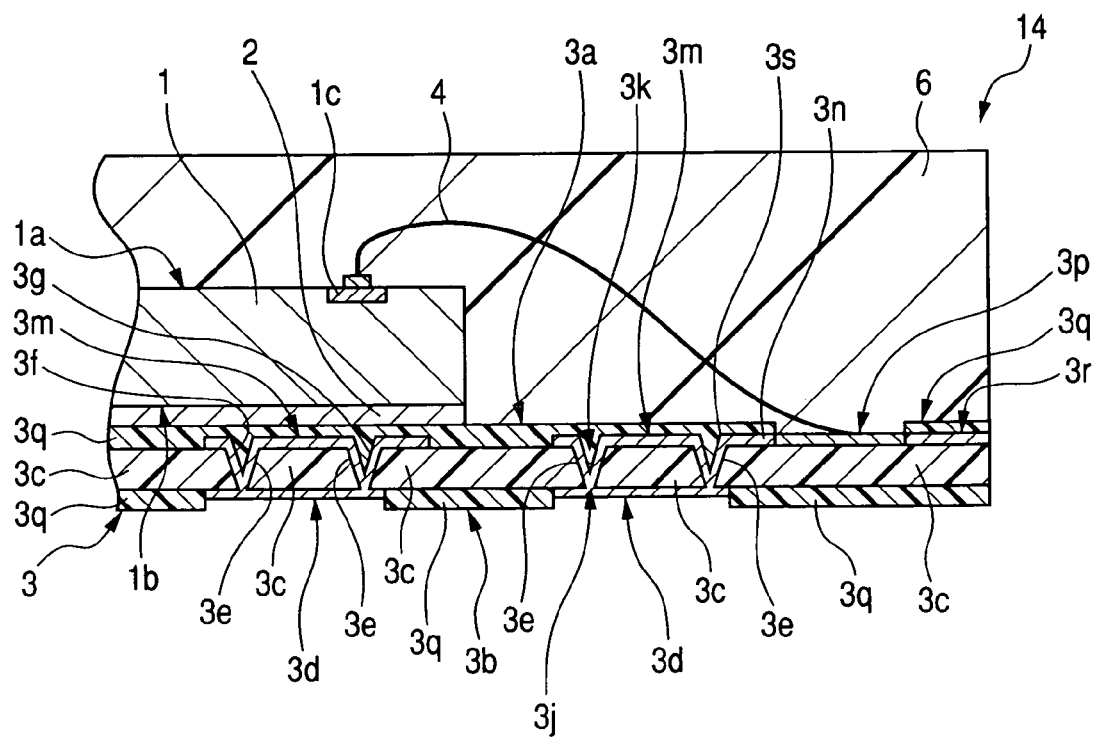
FIG. 29 is an enlarged partial sectional view showing the structure of the section A shown in FIG. 28.

FIG. 21 is a plan view showing an example of the conductor pattern on the main surface side of a wiring substrate penetrating a molded body and a semiconductor chip in the semiconductor device of Embodiment 2 of the present invention; FIG. 22 is a sectional view showing an example of the structure of the semiconductor device shown in FIG. 21, FIG. 23 is an enlarged partial sectional view showing the structure of the section A shown in FIG. 22, FIG. 24 is a plan view showing an example of the structure of the wiring substrate included in the semiconductor device shown in FIG. 21, FIG. 25 is a sectional view showing an example of the structure of the wiring substrate shown in FIG. 24, FIG. 26 is an enlarged partial sectional view showing the structure of the section A shown in FIG. 25, FIG. 27 is a plan view showing the conductor pattern on the main surface side of a wiring substrate penetrating a molded body and a semiconductor chip in the semiconductor device of the modification of Embodiment 2 of the present invention, FIG. 28 is a sectional view showing an example of the structure of the semiconductor device shown in FIG. 27, and FIG. 29 is an enlarged partial sectional view showing the structure of the section A shown in FIG. 28.

Figure 23:
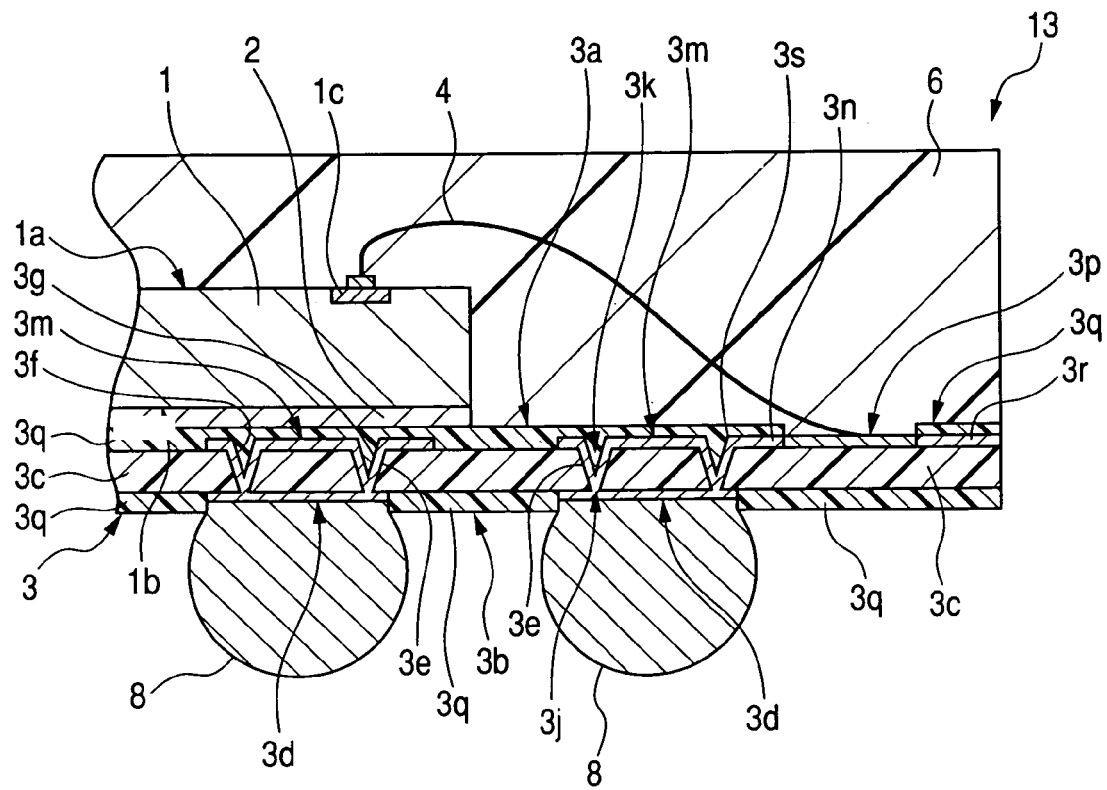
FIG. 23 is an enlarged partial sectional view showing the structure of the section A shown in FIG. 22.

The semiconductor device of Embodiment 2 shown in FIG. 21-FIG. 23 is small CSP 13 of the plastic molded type in which semiconductor chip 1 is mounted on a wiring substrate like CSP 7 shown in the FIG. 1-FIG. 4 of Embodiment 1.

The point of difference between the CSP 7 and CSP 13 is that while in the CSP 7 solder bumps 8 are arranged in a lattice manner at the predetermined interval all over package substrate 3, in CSP 13 solder bumps 8 are arranged with two rows along the peripheral part of back surface 3b of package substrate 3.

Figure 24:
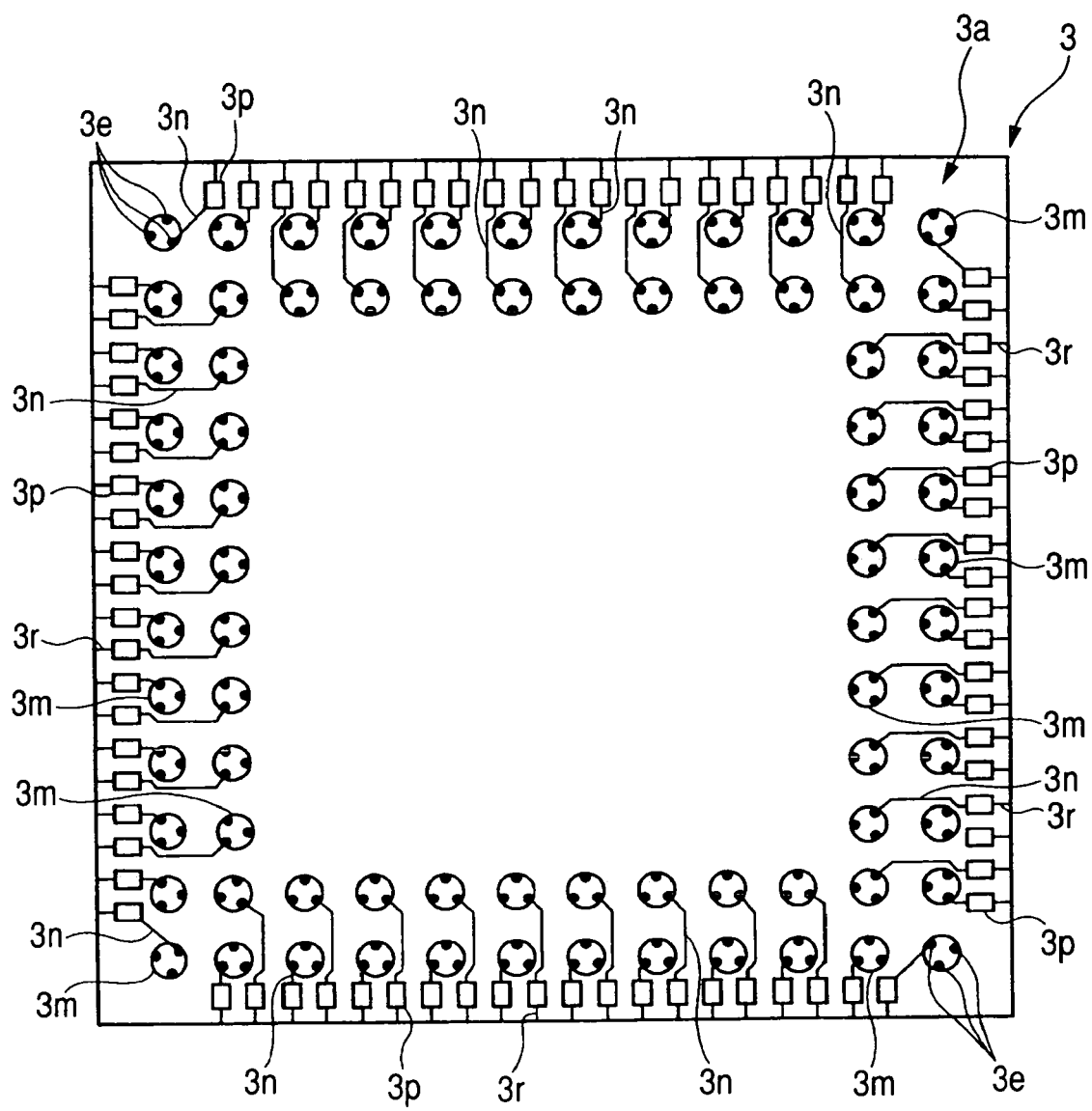
FIG. 24 is a plan view showing an example of the structure of the wiring substrate included in the semiconductor device shown in FIG. 21.

That is, in CSP 13, as shown in FIG. 24, in main surface 3a of package substrate 3, a plurality of terminals 3m are arranged along the peripheral part of package substrate 3 with two rows. Therefore, since corresponding to terminals 3m by one to one, lands 3d on the back surface 3b side are also arranged only with two rows along the peripheral part. Furthermore, since solder bumps 8 are connected to these lands 3d, in CSP 13, solder bump 8 is not arranged near the center corresponding to the bottom of a chip of back surface 3b of package substrate 3. That is, in CSP 13, solder bumps 8 are arranged in two rows along the peripheral part of package substrate 3 in the outside region of back surface 3b of package substrate 3 except for the region under the chip.

As shown in FIG. 24-FIG. 26, also for package substrate 3 of CSP 13, land 3d is arranged at the lower part of each terminal 3m respectively, like package substrate 3 of the CSP 7, and these terminals 3m and lands 3d are electrically connected by plating films 3g of a plurality of through holes 3e.

Since the other structures of CSP 13 of Embodiment 2 and the effects acquired by CSP 13 are the same as those of CSP 7 of Embodiment 1, duplicated explanation is omitted.

Next, the semiconductor device of the modification of Embodiment 2 shown in FIG. 27-FIG. 29 is small CSP 14 of a plastic molded type in which semiconductor chip 1 is mounted on the wiring substrate, like CSP 13 shown in FIG. 21-FIG. 23. The point of difference from the CSP 13 is that the external terminal of CSP 14 is land 3d as shown in FIG. 29.

That is, while the external terminal of CSP 7 and CSP 13 is bump 8, for the external terminal of CSP 14, land 3d formed in back surface 3b of package substrate 3 serves as an external terminal as it is. Therefore, CSP 14 is a LGA (Land Grid Array) type semiconductor package.

Since the other structures of CSP 14 and effects acquired by CSP 14 are the same as those of the CSP 13, duplicated explanation is omitted.

Embodiment 3

Figure 30:
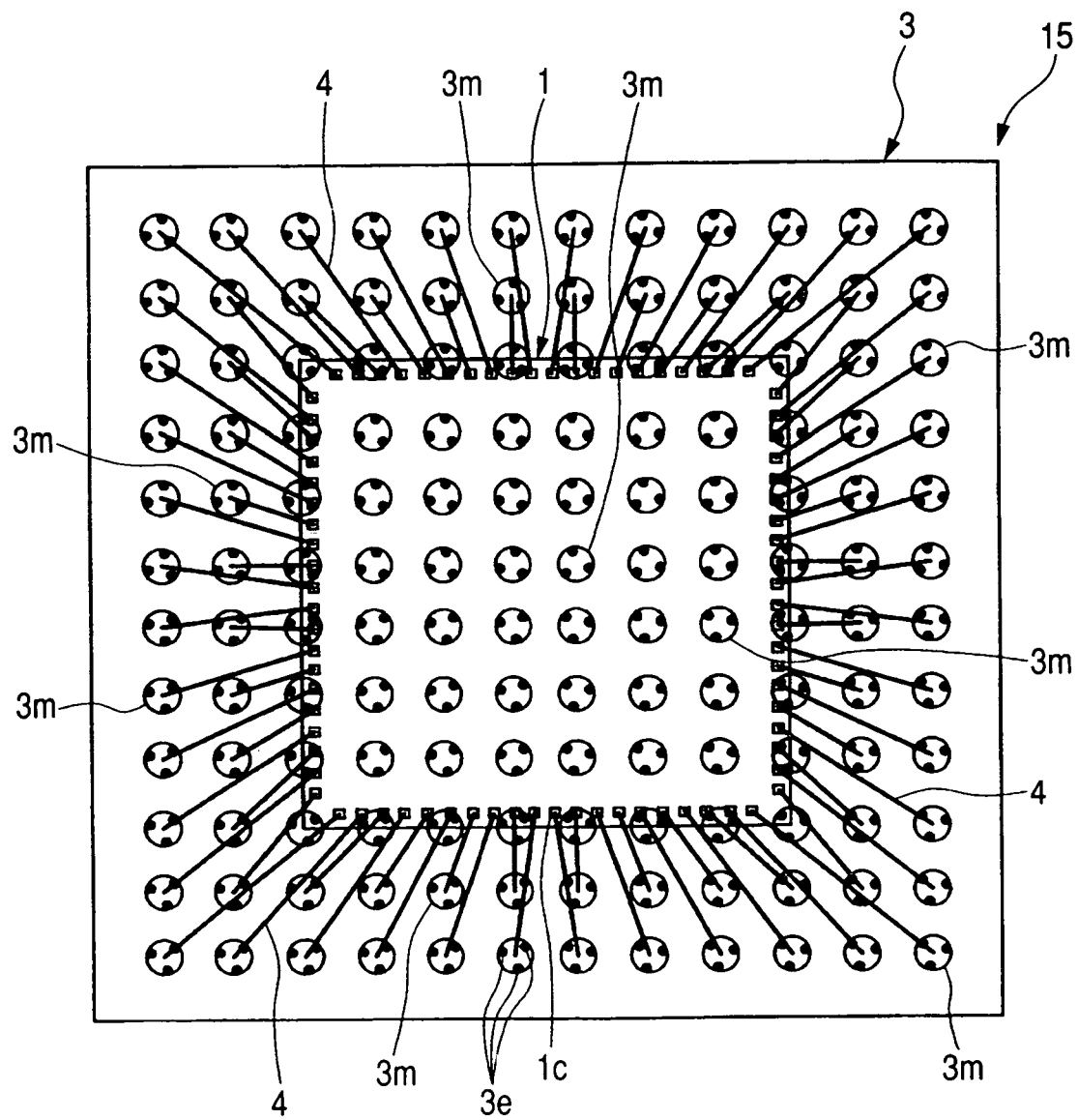
FIG. 30 is a plan view showing an example of the conductor pattern on the main surface side of a wiring substrate penetrating a molded body and a semiconductor chip in the semiconductor device of Embodiment 3 of the present invention.
Figure 31:
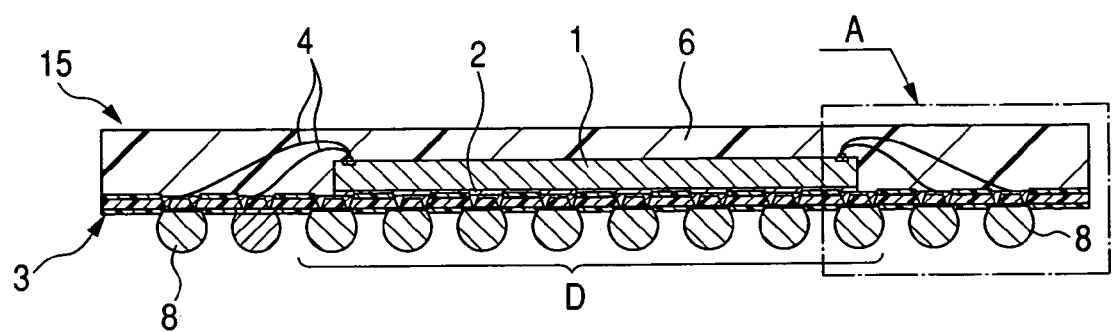
FIG. 31 is a sectional view showing an example of the structure of the semiconductor device shown in FIG. 30.
Figure 32:
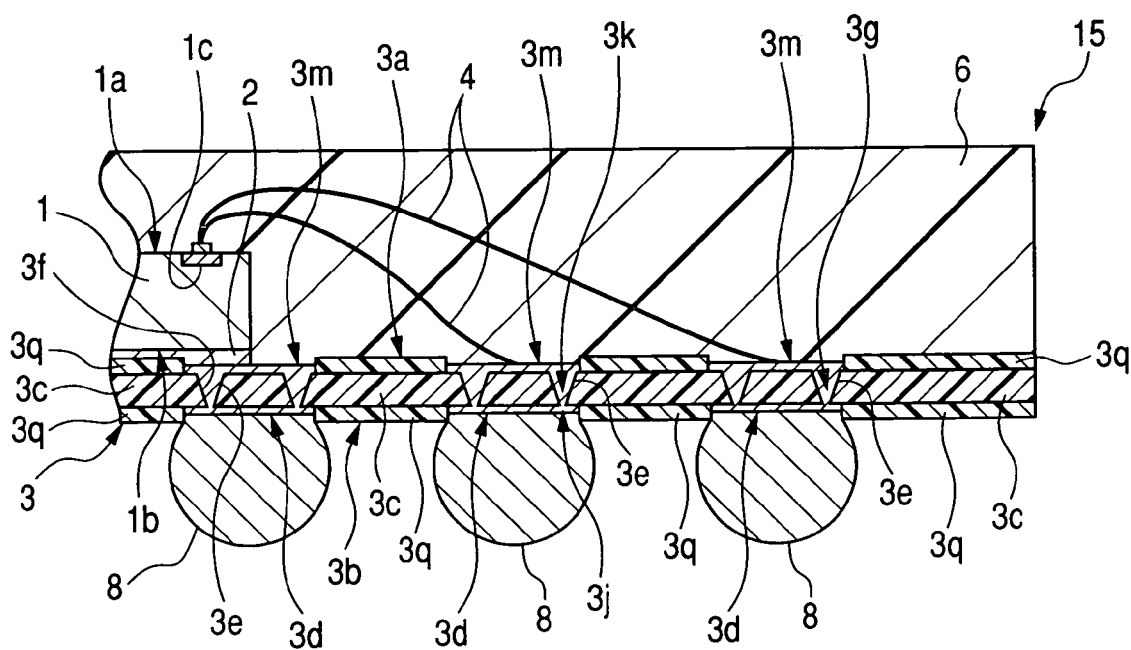
FIG. 32 is an enlarged partial sectional view showing the structure of the section A shown in FIG. 31.
Figure 33:
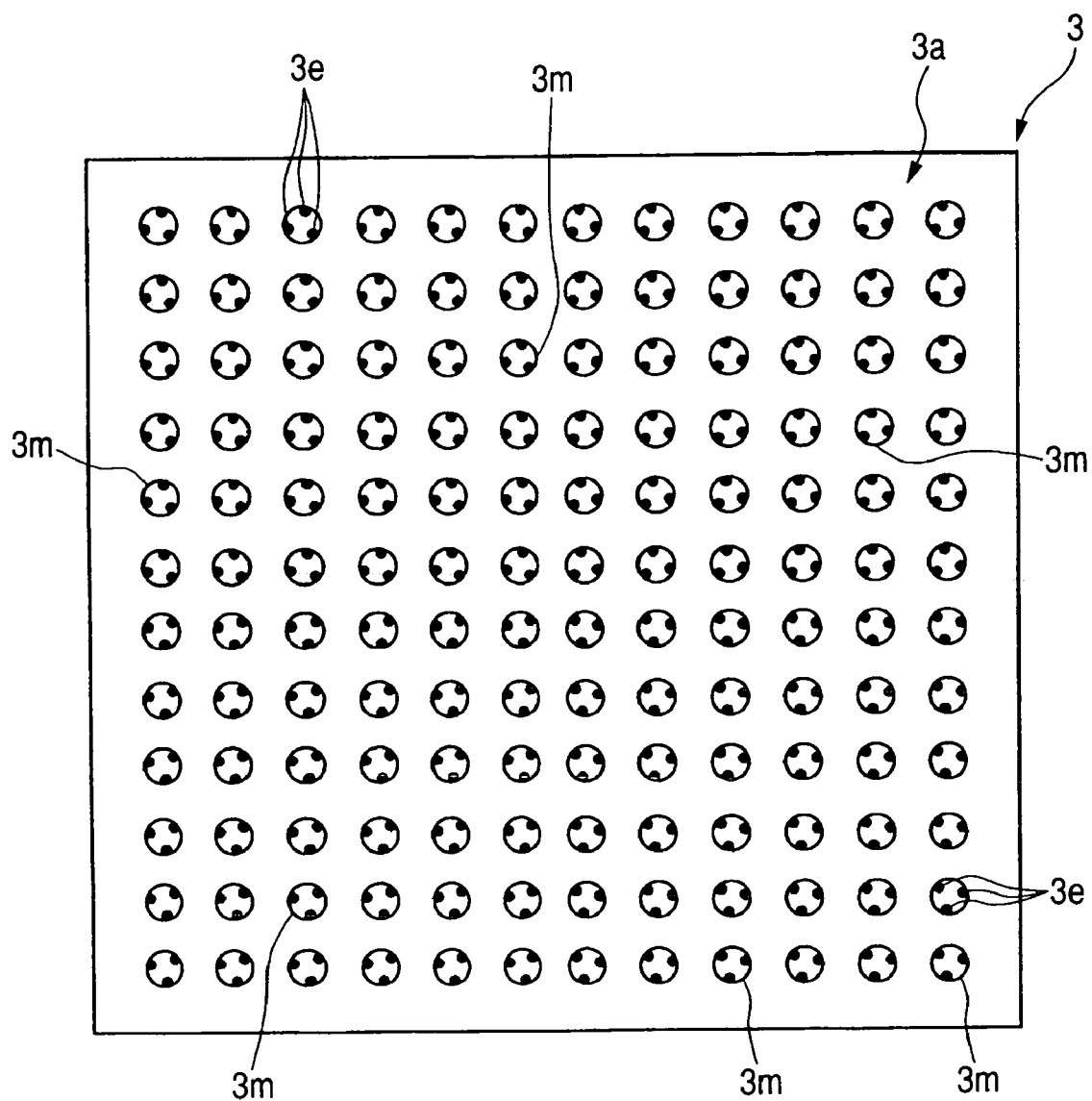
FIG. 33 is a plan view showing an example of the structure of the wiring substrate included in the semiconductor device shown in FIG. 30.
Figure 34:
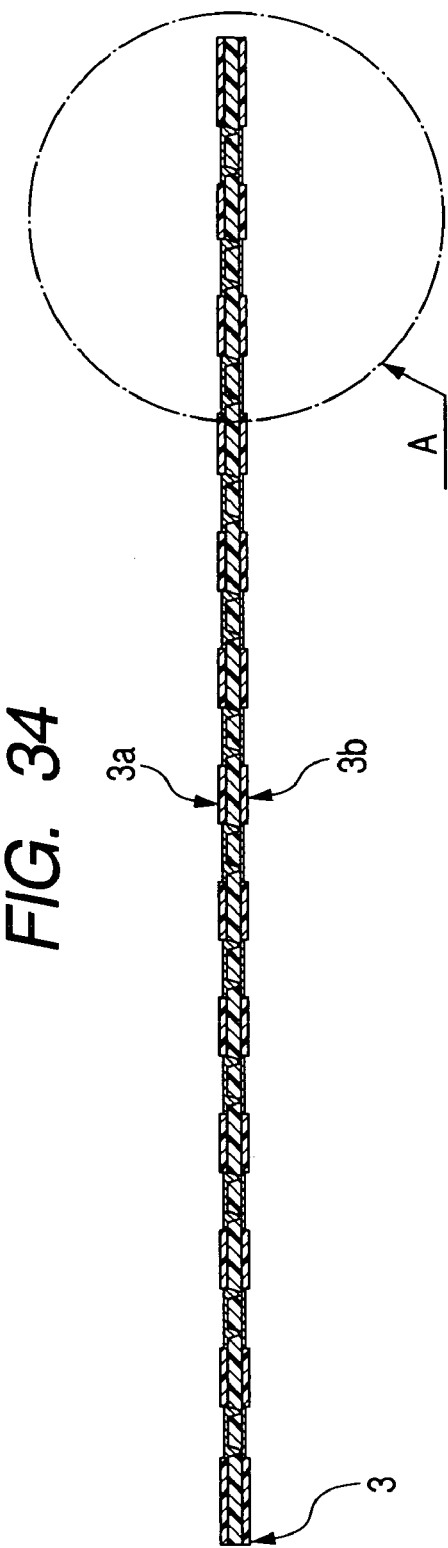
FIG. 34 is a sectional view showing an example of the structure of the wiring substrate shown in FIG. 33.
Figure 35:
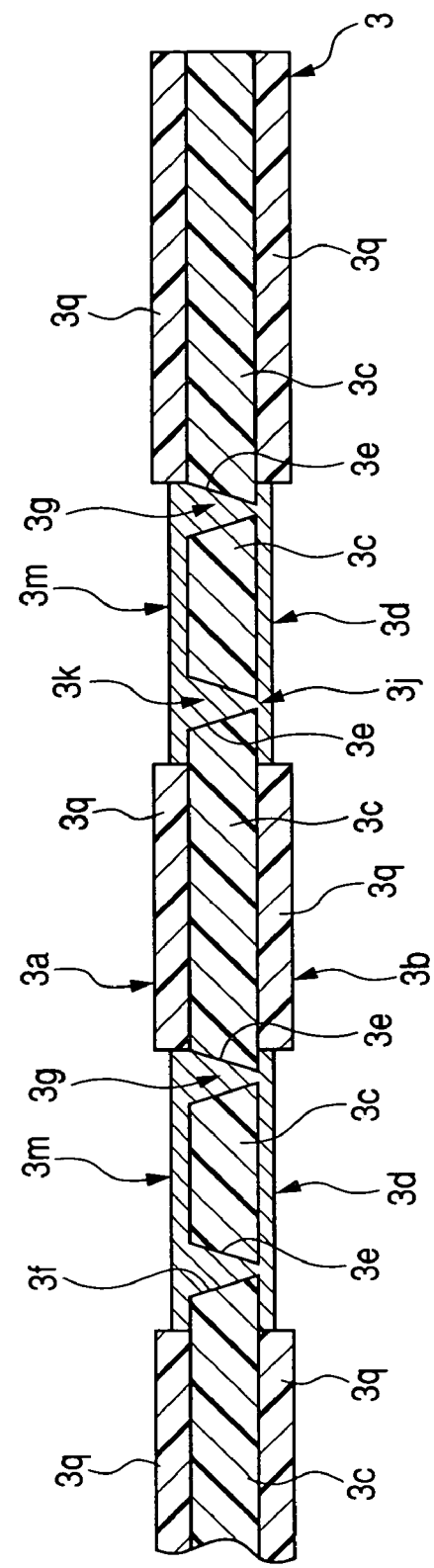
FIG. 35 is an enlarged partial sectional view showing the structure of the section A shown in FIG. 34.
Figure 36:
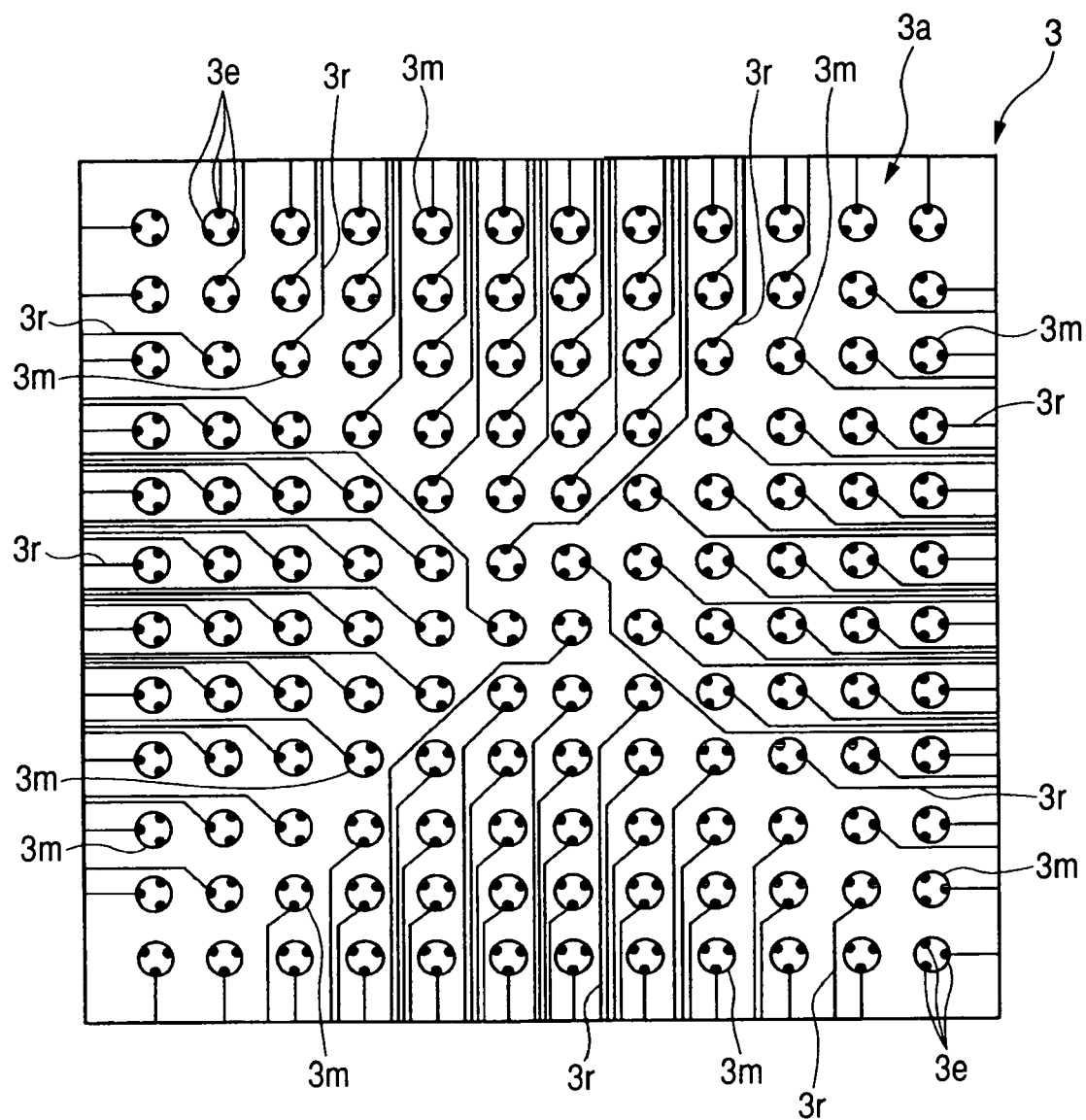
FIG. 36 is a plan view showing the conductor pattern on the main surface side of the wiring substrate of the modification of Embodiment 3 of the present invention.

FIG. 30 is a plan view showing an example of the conductor pattern on the main surface side of a wiring substrate penetrating a molded body and a semiconductor chip in the semiconductor device of Embodiment 3 of the present invention, FIG. 31 is a sectional view showing an example of the structure of the semiconductor device shown in FIG. 30, FIG. 32 is an enlarged partial sectional view showing the structure of the section A shown in FIG. 31, FIG. 33 is a plan view showing an example of the structure of the wiring substrate included in the semiconductor device shown in FIG. 30, FIG. 34 is a sectional view showing an example of the structure of the wiring substrate shown in FIG. 33, FIG. 35 is an enlarged partial sectional view showing the structure of the section A shown in FIG. 34, and FIG. 36 is a plan view showing the conductor pattern on the main surface side of the wiring substrate of the modification of Embodiment 3 of the present invention.

The semiconductor device of Embodiment 3 shown in FIG. 30-FIG. 32 is small CSP 15 of the plastic molded type in which semiconductor chip 1 is mounted on a wiring substrate like CSP 7 shown in the FIG. 1-FIG. 4 of Embodiment 1.

The point of difference between CSP 7 and CSP 15 is that while in CSP 7 terminals for bonding 3p are arranged at the peripheral part of package substrate 3, in CSP 15 conductive wires 4 are directly connected to terminals 3m formed in main surface 3a of package substrate 3.

That is, in CSP 15, as shown in FIG. 30 and FIG. 31, pad 1c of semiconductor chip 1 and terminals 3m of main surface 3a of package substrate 3 are directly connected electrically by conductive wire 4, such as a gold wire.

As shown in FIG. 33, a plurality of terminals 3m are arranged in a lattice manner on main surface 3a of package substrate 3, and as shown in FIG. 34 and FIG. 35, land 3d is formed on the back surface 3b side of each terminal 3m. And terminal 3m and land 3d are electrically connected by plating films 3g in a plurality of through holes 3e. The conductor patterns formed on main surface 3a are formed by an electroless plating method.

CSP 15 is a full grid type semiconductor package like CSP 7 of Embodiment 1. However, as shown in FIG. 30, terminals 3m of rows up to the second rows from the outside are connected with conductive wires 4 among a plurality of terminals 3m arranged in a lattice manner on main surface 3a of package substrate 3. Therefore, solder bumps 8 which are shown in the section D of FIG. 31 and which are arranged as the third rows from the outside and their inside rows are bumps for the bonding reinforcement at the time of substrate mounting while being bumps for the improvement in heat conduction for conducting the heat from semiconductor chip 1 to a mounting substrate.

Either of the front surface or the rear surface of the package substrate 3 can be terminals 3m or lands 3d in CSP 15 of Embodiment 3. Because of this, the surface on which semiconductor chip 1 (solder bump 8) is mounted can be chosen according to need, and the number of contacts of package substrate 3 can be reduced. When opening 3j of the small area in through hole 3e is arranged on the main surface 3a side and opening 3k of a large area is arranged on the back surface 3b side, like the modification shown in FIG. 13 and FIG. 14, since the adhesion area where plating films 3g to which solder bump 8 is connected with base material 3c of package substrate 3 is large, bond strength of solder bump 8 increases, and temperature cycle property improves. Since the usable area of terminal 3m can be taken widely, double bonding and triple bonding to terminal 3m become possible.

Since the other structures of CSP 15 of Embodiment 3 and effects acquired by CSP 15 are the same as those of CSP 7 of Embodiment 1, duplicated explanation is omitted.

Next, in the modification of Embodiment 3 shown in FIG. 36, feeder 3r is connected to each of terminals 3m which are the conductor patterns formed on main surface 3a of package substrate 3, and the conductor pattern of main surface 3a is formed by supplying power by the electrolytic plating method via this feeder 3r.

Even if package substrate 3 shown in FIG. 36 is used, the same effect as CSP 7 of Embodiment 1 can be acquired.

As mentioned above, the present invention accomplished by the present inventors is concretely explained based on above embodiments, but the present invention is not limited by the above embodiments, but variations and modifications may be made, of course, in various ways within the range that does not deviate from the gist.

For example, although, in above-mentioned Embodiment 1, 2 and 3, the case where each of a plurality of terminals 3*m* formed on main surface 3*a* of package substrate 3 is circular is explained, the shape of terminals 3*m* may not be restricted to a circle, but may be polygons, such as a quadrangle, for example.

The present invention is suitable for an electronic device and a semiconductor device with a substrate.

What is claimed is:

1. A semiconductor device, comprising:
   a wiring substrate having a main surface, a back surface opposing to the main surface, a plurality of terminals formed on the main surface, a plurality of lands formed on the back surface, at least one through hole formed between the main surface and the back surface, an insulating film formed over the main surface and the back surface, and a conductive material arranged in the through hole, the conductive material being electrically connected with the land and the terminal;
   a semiconductor chip mounted on the main surface of the wiring substrate;
   a conductive member electrically connecting a pad of the semiconductor chip with one of the terminals of the wiring substrate; and
   an external terminal formed on each of the lands of the back surface of the wiring substrate;
   wherein the through hole has a first opening opened on the main surface of the wiring substrate, and a second opening opened on the back surface of the wiring substrate;
   wherein a size of the first opening of the through hole is larger than that of the second opening of the through hole;
   wherein the first opening is occluded by a part of the insulating film;
   wherein the second opening is occluded by the conductive material; and
   wherein the through hole is formed in a area overlapping with the land and the external terminal in a plane view.

2. The semiconductor device according to claim 1, wherein the through hole is formed by the laser beam machining toward the back surface from the main surface.

3. The semiconductor device according to claim 1, wherein a plurality of the through holes are respectively arranged for each of the plurality of lands.

4. The semiconductor device according to claim 1, wherein a shape of the through hole in a cross section view is a trapezoid, and a shape of the through hole in a plane view is circular.

5. The semiconductor device according to claim 4, wherein the first and second openings are formed to be circular in a plane view, and the second opening has a round shape of 0.02-0.03 mm in said plane view.

6. The semiconductor device according to claim 1, wherein a plating film is formed on the surface of the conductive material formed inside of the through hole.

7. The semiconductor device according to claim 6, wherein the plating film is comprised of a copper alloy.

8. The semiconductor device according to claim 1, wherein a plurality of the through holes are arranged all over the wiring substrate.

9. The semiconductor device according to claim 8, wherein the terminals are arranged in a lattice manner at a predetermined interval.

10. The semiconductor device according to claim 1, wherein the terminals are arranged along a peripheral part of the wiring substrate.

11. The semiconductor device according to claim 1, wherein the conductive member is a conductive wire and the pad of the semiconductor chip and the terminal of the main surface of the wiring substrate are electrically connected by the conductive wire.

12. The semiconductor device according to claim 1, wherein the conductive member is a conductive wire and the pad of the semiconductor chip, and a terminal for bonding connected with the terminal of the main surface of the wiring substrate by a wiring are electrically connected by the conductive wire.

* * * * *